US012751003B2

(12) United States Patent
Kim

(10) Patent No.: US 12,751,003 B2
(45) Date of Patent: Sep. 29, 2026

(54) SEMICONDUCTOR DEVICE COMPRISING CELL GATE CONDUCTIVE LAYER WITH TOP SURFACE AT DIFFERENT LEVELS

(71) Applicant: Samsung Electronics Co., Ltd., Suwon-si (KR)

(72) Inventor: Eunjung Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 337 days.

(21) Appl. No.: 18/503,739

(22) Filed: Nov. 7, 2023

(65) Prior Publication Data

US 2024/0298438 A1 Sep. 5, 2024

(30) Foreign Application Priority Data

Mar. 3, 2023 (KR) ........................ 10-2023-0028490

(51) Int. Cl.
*H10B 12/00* (2023.01)

(52) U.S. Cl.
CPC ............ *H10B 12/50* (2023.02); *H10B 12/09* (2023.02); *H10B 12/315* (2023.02)

(58) Field of Classification Search
None
See application file for complete search history.

(56) References Cited

U.S. PATENT DOCUMENTS 4,864,375 A 9/1989 Teng et al.
4,958,318 A 9/1990 Harari
5,055,898 A 10/1991 Beilstein, Jr. et al.
5,136,533 A 8/1992 Harari
5,142,438 A 8/1992 Reinberg et al.
5,363,327 A 11/1994 Henkles et al.
5,552,620 A 9/1996 Lu et al.
5,899,735 A 5/1999 Tseng
5,909,044 A 6/1999 Chakravarti et al.
5,943,581 A 8/1999 Lu et al.
5,973,344 A 10/1999 Ma et al.
6,096,596 A 8/2000 Gonzalez
6,172,898 B1 1/2001 Kajiyama
6,191,470 B1 2/2001 Forbes et al.
(Continued)

FOREIGN PATENT DOCUMENTS

KR 10-2014-0028302 A 3/2014
KR 20210047032 A 4/2021

*Primary Examiner* — Nduka E Ojeh
(74) *Attorney, Agent, or Firm* — Harness, Dickey & Pierce, P.L.C.

(57) ABSTRACT

Disclosed are semiconductor devices and their fabrication methods. The semiconductor device may include a substrate including first and second cell active patterns and a dummy active pattern, a cell gate dielectric layer on the first and second cell active patterns and the dummy active pattern, a first cell gate conductive layer on the cell gate dielectric layer, and a bit-line structure connected to the first cell active pattern. A distance between the second cell and dummy active patterns is less than that between the first cell and dummy active patterns. The first cell gate conductive layer may include a dummy overlap section overlapping the dummy active pattern and the second cell active pattern, and a cell overlap section overlapping the first cell active pattern. A top surface of the dummy overlap section may be at a level higher than that of a top surface of the cell overlap section.

20 Claims, 23 Drawing Sheets

(56) References Cited

U.S. PATENT DOCUMENTS

| | | | |
|---|---|---|---|
| 6,204,112 B1 | 3/2001 | Chakravarti et al. | |
| 6,261,894 B1 | 7/2001 | Mandelman et al. | |
| 6,355,954 B1 | 3/2002 | Gall et al. | |
| 6,429,068 B1 | 8/2002 | Divakaruni et al. | |
| 6,440,794 B1 | 8/2002 | Kim | |
| 6,465,298 B2 | 10/2002 | Forbes et al. | |
| 6,531,727 B2 | 3/2003 | Forbes et al. | |
| 6,566,190 B2 | 5/2003 | Lee et al. | |
| 6,703,273 B2 | 3/2004 | Wang et al. | |
| 6,831,316 B1 | 12/2004 | Matsuoka et al. | |
| 6,872,640 B1 | 3/2005 | Mouli | |
| 6,890,812 B2 | 5/2005 | Forbes et al. | |
| 6,924,522 B2 | 8/2005 | Ma et al. | |
| 6,980,812 B1 | 12/2005 | Sandhu et al. | |
| 7,195,972 B2 | 3/2007 | Chidambarrao et al. | |
| 7,244,980 B2 | 7/2007 | Weis et al. | |
| 7,291,533 B2 | 11/2007 | von Schwerin | |
| 7,955,940 B2 | 6/2011 | Dyer et al. | |
| 8,716,116 B2 | 5/2014 | Parekh et al. | |
| 8,895,400 B2 | 11/2014 | Seo et al. | |
| 10,566,334 B2 | 2/2020 | Lee | |
| 10,600,791 B2 | 3/2020 | Kim et al. | |
| 11,329,048 B2 | 5/2022 | Walker et al. | |
| 2014/0131786 A1* | 5/2014 | Ryu | H10B 12/053 257/316 |
| 2015/0303200 A1 | 10/2015 | Yuki | |
| 2018/0226411 A1* | 8/2018 | Jung | H10B 10/12 |
| 2021/0118886 A1* | 4/2021 | Choi | H10B 12/09 |
| 2022/0037508 A1 | 2/2022 | Kim et al. | |
| 2022/0139927 A1 | 5/2022 | Chang et al. | |
| 2022/0157830 A1 | 5/2022 | Wu | |

* cited by examiner

SEMICONDUCTOR DEVICE COMPRISING CELL GATE CONDUCTIVE LAYER WITH TOP SURFACE AT DIFFERENT LEVELS

CROSS-REFERENCE TO RELATED APPLICATION

This U.S. nonprovisional application claims priority under 35 U.S.C § 119 to Korean Patent Application No. 10-2023-0028490 filed on Mar. 3, 2023 in the Korean Intellectual Property Office, the disclosure of which is hereby incorporated by reference in its entirety.

BACKGROUND

The present inventive concepts relate to semiconductor devices, and more particularly, to semiconductor devices including a cell gate conductive layer having an inclined surface.

A semiconductor device attracts attention as an essential element in electronic industry because of its properties such as compactness, multi-functionality, and/or low manufacturing cost. Semiconductor devices may encompass semiconductor memory devices storing logic data, semiconductor logic devices processing operations of logic data, and hybrid semiconductor devices having both memory and logic elements.

Recently, high speed and low consumption of electronic products require that semiconductor devices embedded in the electronic products should have high operating speed and/or lower operating voltage. However, an increase in integration of semiconductor devices may cause a reduction in electrical properties and production yield of semiconductor devices. Accordingly, many studies have been conducted to increase electrical properties and production yield of semiconductor devices.

SUMMARY

Some example embodiments of the present inventive concepts provide semiconductor devices with increased reliability and electrical properties.

According to an example embodiment of the present inventive concepts, a semiconductor device may include a substrate including a first cell active pattern, a second cell active pattern, and a dummy active pattern, a cell gate dielectric layer on the first cell active pattern, the second cell active pattern, and the dummy active pattern, a first cell gate conductive layer on the cell gate dielectric layer, and a bit-line structure electrically connected to the first cell active pattern. A distance between the second cell active pattern and the dummy active pattern may be less than a distance between the first cell active pattern and the dummy active pattern. The first cell gate conductive layer may include, a dummy overlap section overlapping the dummy active pattern and the second cell active pattern and a cell overlap section overlapping the first cell active pattern. A top surface of the dummy overlap section may be at a level higher than a level of a top surface of the cell overlap section.

According to an example embodiment of the present inventive concepts, a semiconductor device may include a substrate including a first cell active pattern and a dummy active pattern, a cell gate dielectric layer on the first cell active pattern and the dummy active pattern, a cell gate conductive layer on the cell gate dielectric layer, and a bit-line structure electrically connected to the first cell active pattern. The cell gate conductive layer may include a dummy overlap section overlapping the dummy active pattern and a cell overlap section overlapping the first cell active pattern. A maximum thickness of the dummy overlap section may be greater than a maximum thickness of the cell overlap section.

According to an example embodiment of the present inventive concepts, a semiconductor device may include a substrate including a first cell active pattern, a second cell active pattern, and a dummy active pattern, a cell gate dielectric layer on the first cell active pattern, the second cell active pattern, and the dummy active pattern, a first cell gate conductive layer on the cell gate dielectric layer, a second cell gate conductive layer on the first cell gate conductive layer, a cell gate capping layer on the first and second cell gate conductive layers, a dielectric pattern on the cell gate capping layer, a bit-line structure on the dielectric pattern, a node contact on the first cell active pattern, a landing pad on the node contact, and a data storage pattern electrically connected to the landing pad. The first cell gate conductive layer may include a first top surface in contact with the second cell gate conductive layer and a second top surface in contact with the cell gate capping layer. The first top surface may be at a level lower than a level of the second top surface.

According to an example embodiment of the present inventive concepts, a method of fabricating a semiconductor device may include forming a cell active pattern and a dummy active pattern on a substrate, forming a trench to penetrate the cell active pattern and the dummy active pattern, forming a preliminary conductive layer to fill the trench, wherein the preliminary conductive layer includes a first part overlapping the cell active pattern and a second part overlapping the dummy active pattern, forming a photoresist pattern to expose the first part of the preliminary conductive layer, and etching the first part of the preliminary conductive layer using the photoresist pattern.

DETAILED DESCRIPTION

The following will describe semiconductor devices and methods of fabricating the same according to some example embodiments of the present inventive concepts in conjunction with the accompanying drawings.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1A:
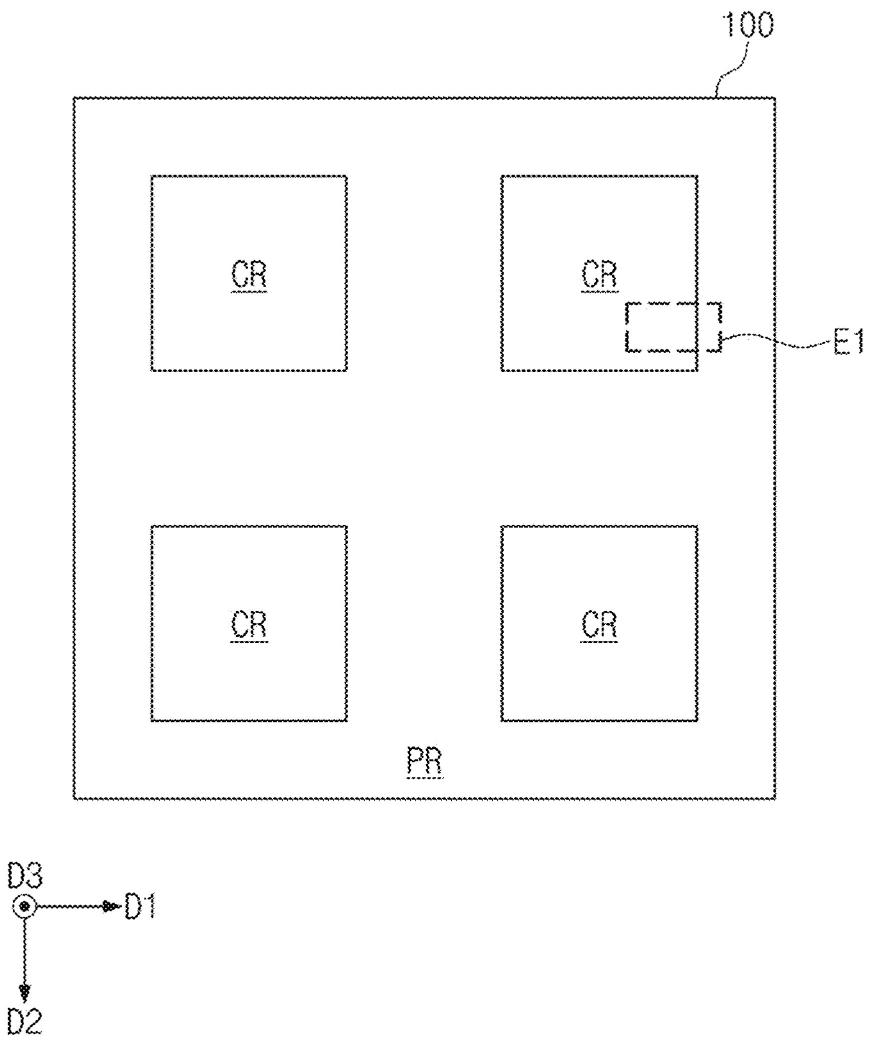
FIG. 1A illustrates a plan view showing a semiconductor device according to an example embodiment.
Figure 1B:
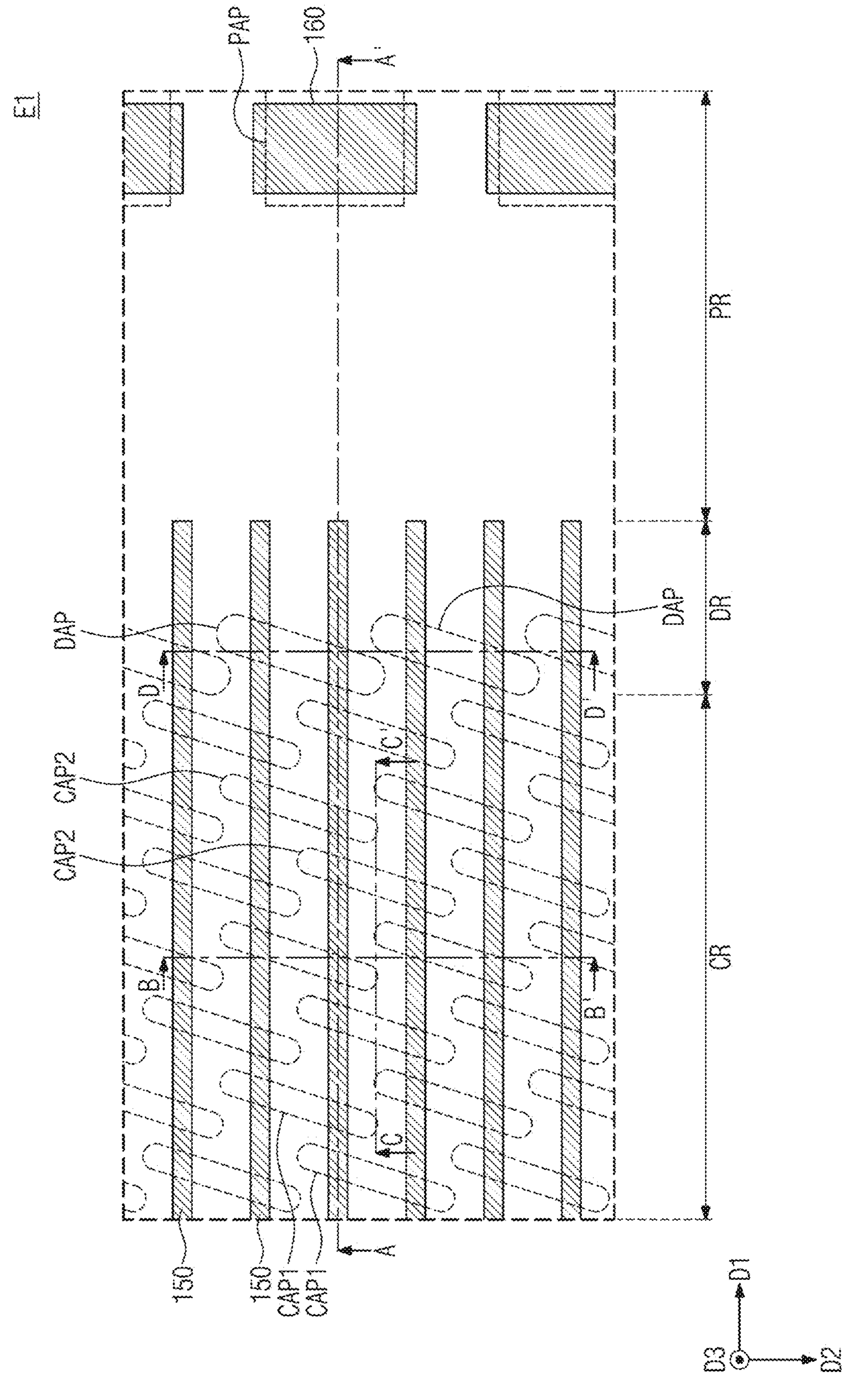
FIG. 1B illustrates an enlarged view showing section E1 of FIG. 1A.
Figure 1C:
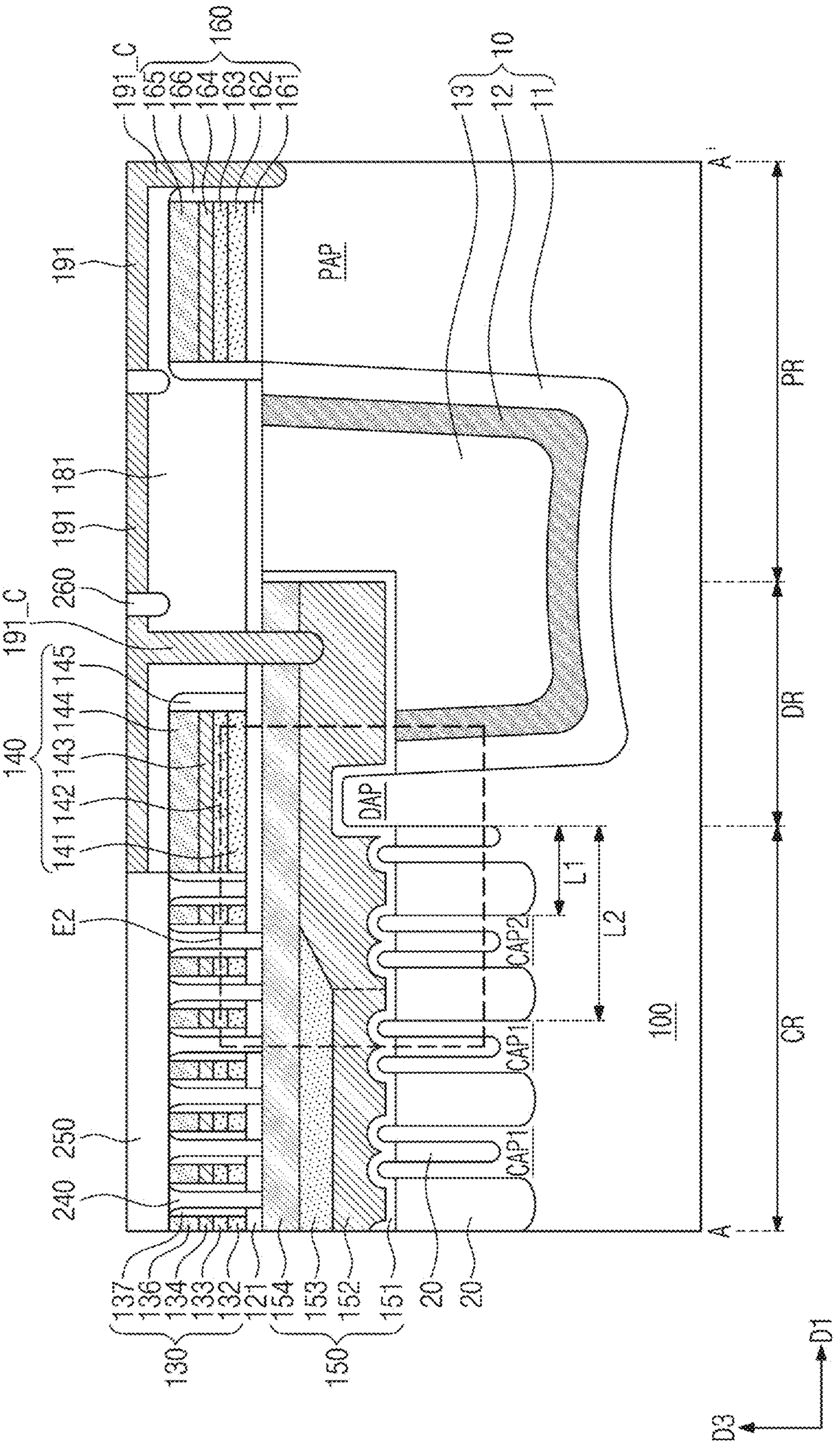
FIG. 1C illustrates a cross-sectional view taken along line A-A' of FIG. 1B.
Figure 1D:
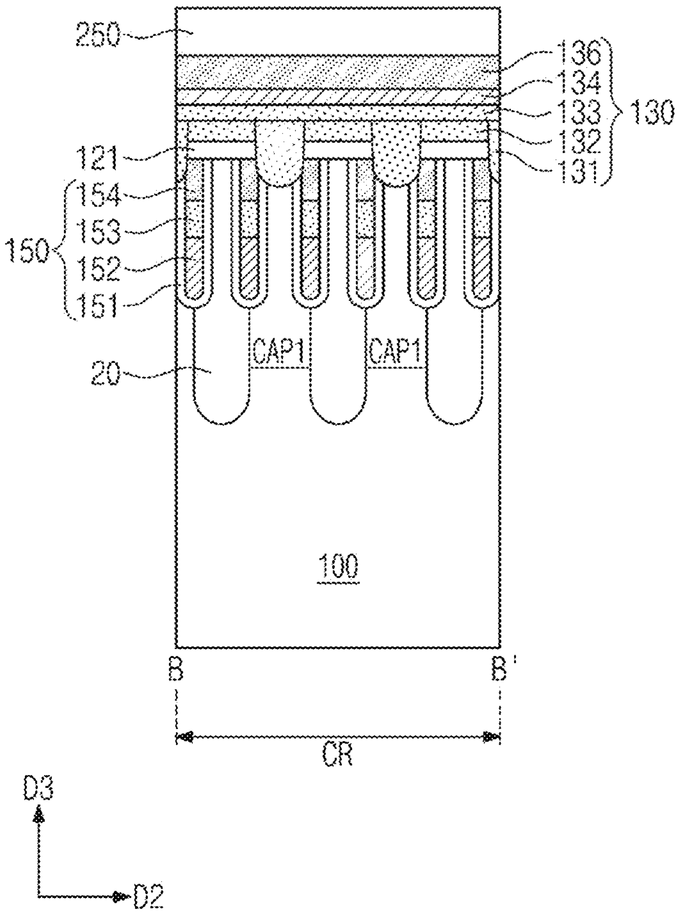
FIG. 1D illustrates a cross-sectional view taken along line B-B' of FIG. 1B.
Figure 1E:
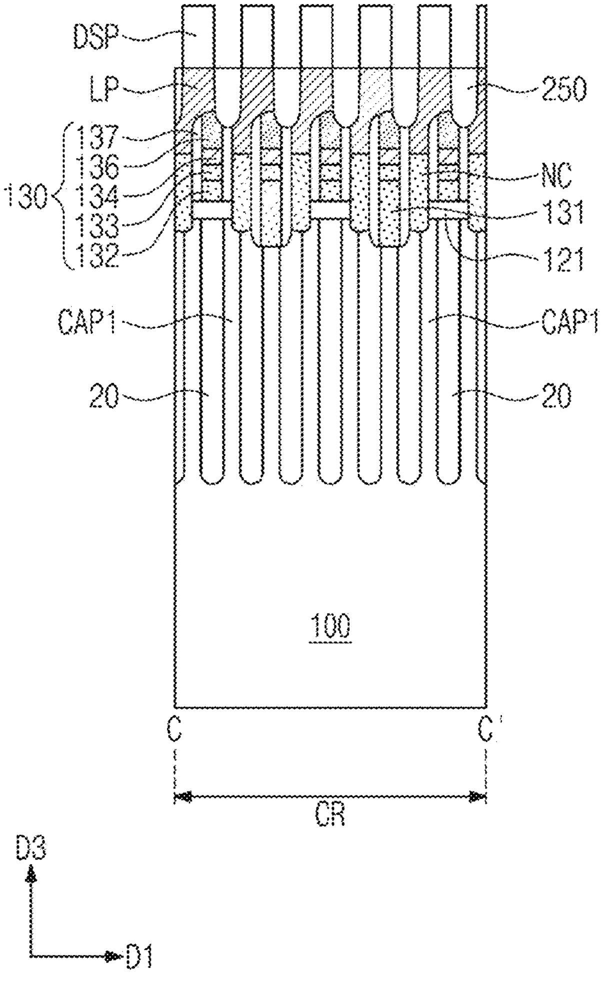
FIG. 1E illustrates a cross-sectional view taken along line C-C' of FIG. 1B.
Figure 1F:
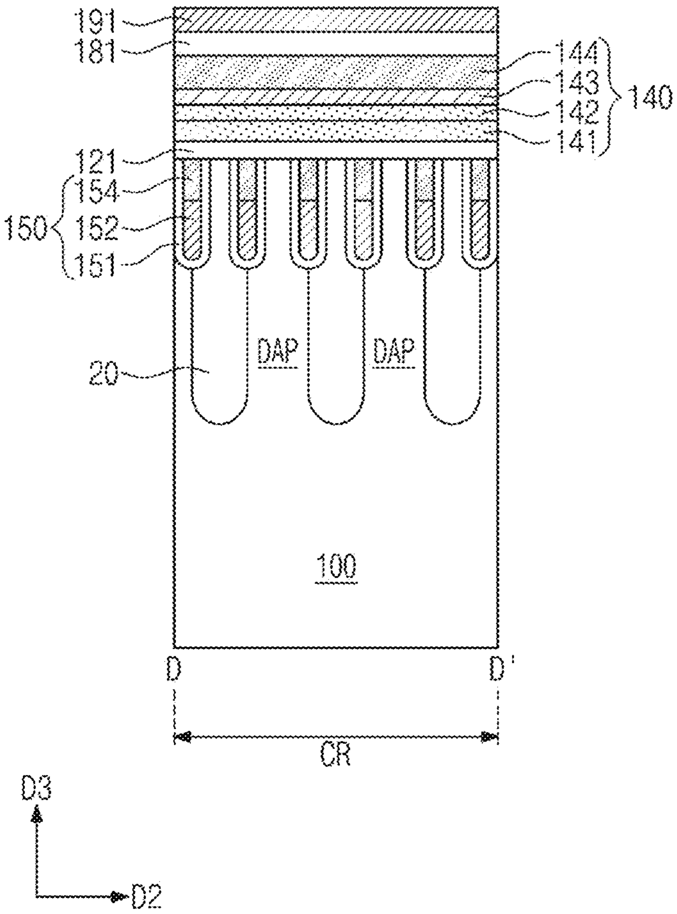
FIG. 1F illustrates a cross-sectional view taken along line D-D' of FIG. 1B.
Figure 1G:
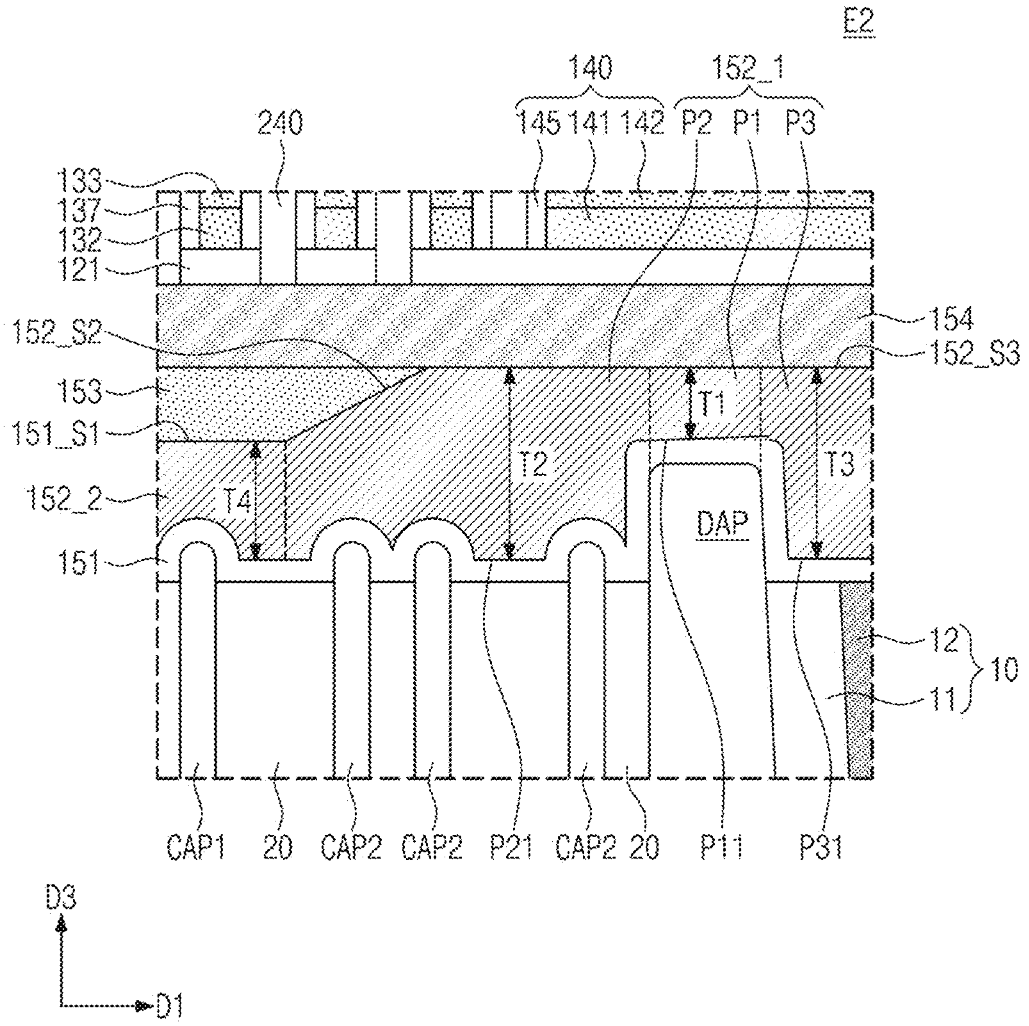
FIG. 1G illustrates an enlarged view showing section E2 of FIG. 1C.

FIG. 1A illustrates a plan view showing a semiconductor device according to an example embodiment. FIG. 1B illustrates an enlarged view showing section E1 of FIG. 1A. FIG. 1C illustrates a cross-sectional view taken along line A-A' of FIG. 1B. FIG. 1D illustrates a cross-sectional view taken along line B-B' of FIG. 1B. FIG. 1E illustrates a cross-sectional view taken along line C-C' of FIG. 1B. FIG. 1F illustrates a cross-sectional view taken along line D-D' of FIG. 1B. FIG. 1G illustrates an enlarged view showing section E2 of FIG. 1C.

Referring to FIGS. 1A, 1B, 1C, 1D, 1E, and 1F, a semiconductor device may include a substrate 100. In some example embodiments, the substrate 100 may be a semiconductor substrate. For example, the substrate 100 may include silicon (Si), germanium (Ge), silicon-germanium (SiGe), gallium phosphide (GaP), or gallium arsenide (GaAs). In some example embodiments, the substrate 100 may be a silicon-on-insulator (SOI) substrate or a germanium-on-insulator (GOI) substrate. The substrate 100 may have a plate shape that extends along a plane elongated in a first direction D1 and a second direction D2. The first direction D1 and the second direction D2 may intersect each other. For example, the first direction D1 and the second direction D2 may be horizontal directions that are orthogonal to each other.

The substrate 100 may include cell regions CR and a peripheral region PR that surrounds the cell regions CR. The substrate 100 may further include a dummy region DR between the cell region CR and the peripheral region PR. The cell region CR, the dummy region DR, and the peripheral region PR may be distinguished from each other when viewed on a plane defined by the first direction D1 and the second direction D2.

The cell region CR of the substrate 100 may include cell active patterns CAP1 and CAP2. The cell region CR of the substrate 100 may have upper portions that protrude in a third direction D3, and the active patterns CAP1 and CAP2 may be defined to indicate the protruding upper portions of the cell region CR. The third direction D3 may intersect the first direction D1 and the second direction D2. For example, the third direction D3 may be a vertical direction perpendicular to the first direction D1 and the second direction D2. The cell active patterns CAP1 and CAP2 may be spaced apart from each other.

The dummy region DR of the substrate 100 may include dummy active patterns DAP. The dummy region DR of the substrate 100 may have upper portions that protrude in the third direction D3, and the dummy active patterns DAP may define the protruding upper portions of the dummy region DR.

The cell active patterns CAP1 and CAP2 may include first cell active patterns CAP1 and second cell active patterns CAP2. The second cell active patterns CAP2 may be disposed adjacent to the dummy active pattern DAP. The second cell active patterns CAP2 may be disposed between the first cell active patterns CAP1 and the dummy active patterns DAP. A distance between the second cell active pattern CAP2 and the dummy active pattern DAP may be less than that between the first cell active pattern CAP1 and the dummy active pattern DAP. For example, a first distance L1 in the first direction D1 between the second cell active pattern CAP2 and the dummy active pattern DAP may be less than a second distance L2 in the first direction D1 between the first cell active pattern CAP1 and the dummy active pattern DAP.

A device isolation layer 20 may define the first and second cell active patterns CAP1 and CAP2. The device isolation layer 20 may be provided in the cell region CR of the substrate 100. Each of the first and second cell active patterns CAP1 and CAP2 may be surrounded by the device isolation layer 20.

A dielectric structure 10 may be provided in the substrate 100. The dielectric structure 10 may be provided between the dummy region DR and the peripheral region PR. In some example embodiments, the dielectric structure 10 and the device isolation layer 20 may be connected to have a single unitary structure with no boundary therebetween. The dielectric structure 10 may define the dummy active pattern DAP.

The device isolation layer 20 may include a dielectric material. For example, the device isolation layer 20 may include one or both of oxide and nitride. The dielectric structure 10 may include a first dielectric layer 11, a second dielectric layer 12 on the first dielectric layer 11, and a third dielectric layer 13 on the second dielectric layer 12. For example, the first dielectric layer 11 may include oxide, the second dielectric layer 12 may include nitride, and the third dielectric layer 13 may include oxide.

A plurality of cell gate structures 150 may extend in the first direction D1. The cell gate structures 150 may be arranged in the second direction D2. The cell gate structure 150 may be provided on the cell region CR and the dummy region DR of the substrate 100. The cell gate structure 150 may be provided on the device isolation layer 20, the dielectric structure 10, the first and second cell active patterns CAP1 and CAP2, and the dummy active patterns DAP. The cell gate structure 150 may be a buried gate structure that is buried in the device isolation layer 20, the dielectric structure 10, the first and second cell active patterns CAP1 and CAP2, and the dummy active patterns DAP. The cell gate structure 150 and the cell active patterns CAP1 and CAP2 may define cell transistors. Two cell gate structures 150 may be provided on one dummy active pattern DAP. The two cell gate structures 150 may penetrate (or extend) in the first direction D1 through the one dummy active pattern DAP.

The cell gate structure 150 may include a cell gate dielectric layer 151 on the first, second, and dummy cell active patterns CAP1, CAP2, and DAP, a first cell gate conductive layer 152 on the cell gate dielectric layer 151, a second cell gate conductive layer 153 on the first cell gate conductive layer 152, and a cell gate capping layer 154 on the first and second cell gate conductive layers 152 and 153.

The cell gate dielectric layer 151 and the cell gate capping layer 154 may include a dielectric material. For example, the cell gate dielectric layer 151 may include oxide, and the cell gate capping layer 154 may include nitride.

The first and second cell gate conductive layers 152 and 153 may include a conductive material. For example, the first cell gate conductive layer 152 may include titanium nitride, and the second cell gate conductive layer 153 may include polysilicon.

A dielectric pattern 121 may be provided on the dielectric structure 10, the device isolation layer 20, and the cell gate capping layer 154 of the cell gate structure 150. The dielectric pattern 121 may include a dielectric material. In some example embodiments, the dielectric pattern 121 may include a plurality of dielectric layers.

A plurality of bit-line structures 130 may extend in the second direction D2. The bit-line structures 130 may be arranged in the first direction D1. The bit-line structures 130 may be provided on the cell region CR of the substrate 100. The bit-line structures 130 may be provided on the dielectric pattern 121 and the cell active patterns CAP1 and CAP2. The bit-line structures 130 may be electrically connected to the cell active patterns CAP1 and CAP2.

Each of the bit-line structures 130 may include bit-line contacts 131, first conductive layers 132, a second conductive layer 133, a third conductive layer 134, a bit-line capping layer 136, and a bit-line spacer 137.

The bit-line contacts 131 of the bit-line structure 130 may be arranged in the second direction D2. The first conductive layers 132 of the bit-line structure 130 may be arranged in the second direction D2. The bit-line contacts 131 and the first conductive layers 132 of the bit-line structure 130 may be disposed alternately with each other along the second direction D2. The bit-line contact 131 may be disposed on the cell active pattern CAP1 or CAP2. The bit-line contact 131 may penetrate the dielectric pattern 121. The first conductive layer 132 may be provided on the dielectric pattern 121. The bit-line contact 131 and the first conductive layer 132 may include a conductive material. For example, the bit-line contact 131 and the first conductive layer 132 may include polysilicon. In some example embodiments, the bit-line contacts 131 and the first conductive layers 132 included in one bit-line structure 130 may be connected to have a single unitary structure with no boundary therebetween.

The second conductive layer 133 may be provided on the bit-line contacts 131 and the first conductive layers 132. The third conductive layer 134 may be provided on the second conductive layer 133. The bit-line capping layer 136 may be provided on the third conductive layer 134. The second conductive layer 133 and the third conductive layer 134 may include a conductive material. For example, the second conductive layer 133 may include polysilicon, and the third conductive layer 134 may include metal. The bit-line capping layer 136 may include a dielectric material. In some example embodiments, the number of conductive layers included in one bit-line structure 130 may be greater or less than that shown.

The bit-line spacer 137 may cover a sidewall of the bit-line capping layer 136, sidewalls of the first, second, and third conductive layers 132, 133, and 134, and sidewalls of the bit-line contacts 131. The bit-line spacer 137 may include a dielectric material. In some example embodiments, the bit-line spacer 137 may include a plurality of dielectric layers.

A plurality of node contacts NC may be provided. The node contacts NC may be provided on the cell active patterns CAP1 and CAP2. The node contact NC may be provided between the bit-line structures 130 that are adjacent to each other. The node contact NC may be provided on a sidewall of the bit-line structure 130. The node contact NC may include a conductive material. For example, the node contact NC may include polysilicon.

A plurality of landing pads LP may be provided. The landing pad LP may be provided on the node contact NC. The landing pad LP may include a conductive material. For example, the landing pad LP may include metal. In some example embodiments, a metal silicide layer may be provided between the node contact NC and the landing pad LP. In some example embodiments, a barrier layer may be provided between the node contact NC and the landing pad LP.

A plurality of dielectric fences 240 may be provided. The dielectric fence 240 may be provided on the cell gate capping layer 154 of the cell gate structure 150. The dielectric fence 240 may be provided between the node contacts NC that are adjacent to each other in the second direction D2. The dielectric fence 240 may be provided between the bit-line structures 130 that are adjacent to each other in the first direction D1. The dielectric fence 240 may include a dielectric material.

A first separation structure 250 may be provided on the dielectric fence 240. The first separation structure 250 may separate the landing pads LP from each other. The first separation structure 250 may surround the landing pad LP. The first separation structure 250 may include a dielectric material.

A plurality of data storage patterns DSP may be provided. The data storage pattern DSP may be electrically connected to the cell active pattern CAP1 or CAP2 through the landing pad LP and the node contact NC. In some example embodiments, each of the data storage patterns DSP may be a capacitor including a bottom electrode, a dielectric layer, and a top electrode. In this case, the semiconductor device including the data storage patterns DSP may be a dynamic random access memory (DRAM). In some example embodiments, each of the data storage patterns DSP may include a magnetic tunnel junction pattern. In this case, the semiconductor device including the data storage patterns DSP may be a magnetic random access memory (MRAM). In some example embodiments, the data storage patterns DSP may include a phase change material or a variable resistance material. In this case, the semiconductor device including the data storage patterns DSP may be a phase change random access memory (PRAM) or a resistive random access memory (ReRAM). In some example embodiments, each of the data storage patterns DSP may include various materials and/or structures capable of storage data.

A dummy line structure 140 may be provided. The dummy line structure 140 may extend in the second direction D2. The dummy line structure 140 may overlap in the third direction D3 with the dummy active pattern DAP. The dummy line structure 140 may be provided on the dielectric pattern 121.

The dummy line structure 140 on the dummy region DR of the substrate 100 may include a first dummy conductive layer 141 on the dielectric pattern 121, a second dummy conductive layer 142 on the first dummy conductive layer 141, a third dummy conductive layer 143 on the second dummy conductive layer 142, a dummy capping layer 144 on the third dummy conductive layer 143, and a dummy line spacer 145.

The first, second, and third dummy conductive layers 141, 142, and 143 may include a conductive material. For example, the first and second dummy conductive layers 141 and 142 may include polysilicon, and the third dummy conductive layer 143 may include metal. The dummy capping layer 144 may include a dielectric material. The dummy line spacer 145 may cover a sidewall of the dummy capping layer 144 and sidewalls of the first, second, and third dummy conductive layers 141, 142, and 143. The dummy line spacer 145 may include a dielectric material.

The substrate 100 may further include peripheral active patterns PAP. The peripheral region PR of the substrate 100 may have upper portions that protrude in the third direction D3, and the peripheral active patterns PAP may indicate the protruding upper portions of the peripheral region PR.

The substrate 100 may be provided with peripheral gate structures 160 on the peripheral region PR. The peripheral gate structure 160 may be provided on the peripheral active pattern PAP. In some embodiments, the peripheral gate structure 160 may be a gate of a transistor that constitutes a sub-word line driver.

The peripheral gate structure 160 may include a peripheral dielectric layer 161, a first peripheral conductive layer 162 on the peripheral dielectric layer 161, a second peripheral conductive layer 163 on the first peripheral conductive layer 162, a third peripheral conductive layer 164 on the second peripheral conductive layer 163, a peripheral capping layer 165 on the third peripheral conductive layer 164, and peripheral spacers 166. The first, second, and third peripheral conductive layers 162, 163, and 164 may include a conductive material. For example, the first and second peripheral conductive layers 162 and 163 may include polysilicon, and the third peripheral conductive layer 164 may include metal. The peripheral dielectric layer 161, the peripheral capping layer 165, and the peripheral spacer 166 may include a dielectric material.

A filling dielectric layer 181 may be provided to cover the dummy line structure 140 and the peripheral gate structure 160. The filling dielectric layer 181 may include a dielectric material. In some example embodiments, the filling dielectric layer 181 may include a plurality of dielectric layers.

A plurality of conductive structures 191 may be provided on the filling dielectric layer 181. The conductive structures 191 may include a conductive material. At least one of the conductive structures 191 may include a conductive contact 191_C electrically connected to the cell gate structure 150. At least one of the conductive structures 191 may include a conductive contact 191_C electrically connected to the peripheral active pattern PAP.

A plurality of second separation structures 260 may be provided on the filling dielectric layer 181. The second separation structure 260 may separate the conductive structures 191 from each other. The second separation structure 260 may include a dielectric material. In some example embodiments, the first separation structure 250 and the second separation structure 260 may be connected to have a single unitary structure with no boundary therebetween.

The dummy active pattern DAP may have a maximum width greater than that of each of the first and second cell active patterns CAP1 and CAP2. For example, a maximum width in the first direction D1 of the dummy active pattern DAP may be greater than a maximum width in the first direction D1 of each of the first and second cell active patterns CAP1 and CAP2. An uppermost portion of the dummy active pattern DAP may be located at a level higher than that of uppermost portions of the first and second cell active patterns CAP1 and CAP2.

Referring to FIG. 1G, the first cell gate conductive layer 152 may include a dummy overlap section 152_1 that overlaps in the third direction D3 with the dummy active pattern DAP and the second cell active patterns CAP2, and may also include a cell overlap section 152_2 that overlaps in the third direction D3 with the first cell active patterns CAP1.

The dummy overlap section 152_1 may have a maximum thickness greater than that of the cell overlap section 152_2. For example, a maximum thickness T2 or T3 in the third direction D3 of the dummy overlap section 1521 may be greater than a maximum thickness in the third thickness T4 of the cell overlap section 152_2.

The first cell gate conductive layer 152 may have a first top surface 152_S1 in contact with the second cell gate conductive layer 153, a second top surface 152_S3 in contact with the cell gate capping layer 154, and an inclined surface 152_S2. The inclined surface 152_S2 may connect the first top surface 152_S1 of the first cell gate conductive layer 152 to the second top surface 152_S3 of the first cell gate conductive layer 152. The inclined surface 152_S2 may be in contact with the second cell gate conductive layer 153. The inclined surface 152_S2 may be spaced apart from the cell gate capping layer 154. The inclined surface 152_S2 may be located at a level that rises with decreasing distance from the second top surface 152_S3 of the first cell gate conductive layer 152. The level of the inclined surface 152_S2 may rise with decreasing a distance from the dummy active pattern DAP. In other words, the level of the inclined surface 152_S2 may rise as a distance from the dummy active pattern DAP decreases. The first top surface 152_S1 of the first cell gate conductive layer 152 may be located at a level lower than that of the second top surface 152_S3 of the first cell gate conductive layer 152.

The first top surface 152_S1 of the first cell gate conductive layer 152 may be a top surface of the cell overlap section 152_2 of the first cell gate conductive layer 152. The second top surface 152_S3 of the first cell gate conductive layer 152 may be a top surface of the dummy overlap section 152_1 of the first cell gate conductive layer 152. The dummy overlap section 152_1 of the first cell gate conductive layer 152 may include the inclined surface 152_S2.

The dummy overlap section 152_1 may include a first part P1 that overlaps in the third direction D3 with the dummy active pattern DAP, a second part P2 that overlaps in the third direction D3 with the second cell active pattern CAP2, and a third part P3 that overlaps in the third direction D3 with the dielectric structure 10.

The first part P1 of the dummy overlap section 1521 may have a maximum thickness less than that of the second part P2 of the dummy overlap section 152_1. For example, a maximum thickness T1 in the third direction D3 of the first part P1 of the dummy overlap section 152_1 may be less than a maximum thickness T2 in the third direction D3 of the second part P2 of the dummy overlap section 152_1. The maximum thickness of the first part P1 of the dummy overlap section 152_1 may be less than that of the third part P3 of the dummy overlap section 152_1. For example, the maximum thickness T1 in the third direction D3 of the first part P1 of the dummy overlap section 152_1 may be less than a maximum thickness T3 in the third direction D3 of the third part P3 of the dummy overlap section 152_1. The maximum thickness of the second part P2 of the dummy overlap section 1521 may be the same as that of the third part P3 of the dummy overlap section 152_1. For example, the maximum thickness T2 in the third direction D3 of the second part P2 of the dummy overlap section 1521 may be the same as the maximum thickness T3 in the third direction D3 of the third part P3 of the dummy overlap section 152_1.

The first part P1 of the dummy overlap section 1521 may have a lowermost portion P11 located at a level higher than that of a lowermost portion P21 of the second part P2 of the dummy overlap section 152_1 and higher than that of a lowermost portion P31 of the third part P3 of the dummy overlap section 152_1. The lowermost portion P21 of the second part P2 of the dummy overlap section 1521 may be located at the same level as that of the lowermost portion P31 of the third part P3 of the dummy overlap section 152_1.

In a the semiconductor device according to some example embodiments, as the first cell gate conductive layer 152 includes the dummy overlap section 152_1 having a relatively large thickness, the first cell gate conductive layer 152 may be mitigated or prevented from being cut by the dummy active pattern DAP.

FIGS. 2A, 2B, 3A, 3B, 4A, 4B, 5A, 5B, 6A, and 6B illustrate cross-sectional views showing a method of fabricating a semiconductor device according to FIGS. 1A to 1G.

Figure 2A:
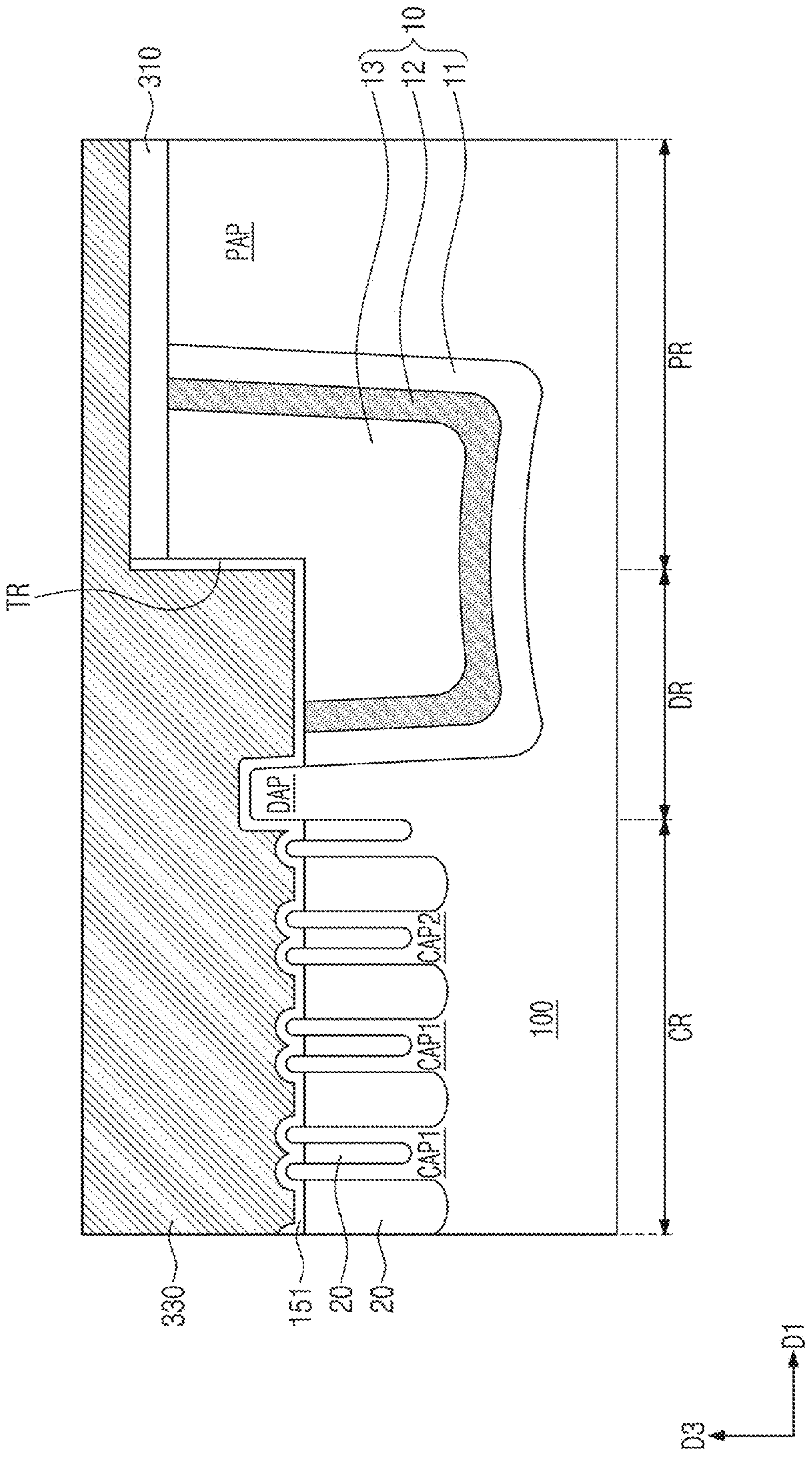
FIGS. 2A, 2B, 3A, 3B, 4A, 4B, 5A, 5B, 6A, and 6B illustrate cross sectional views showing a method of fabricating a semiconductor device according to FIGS. 1A to 1G.
Figure 2B:
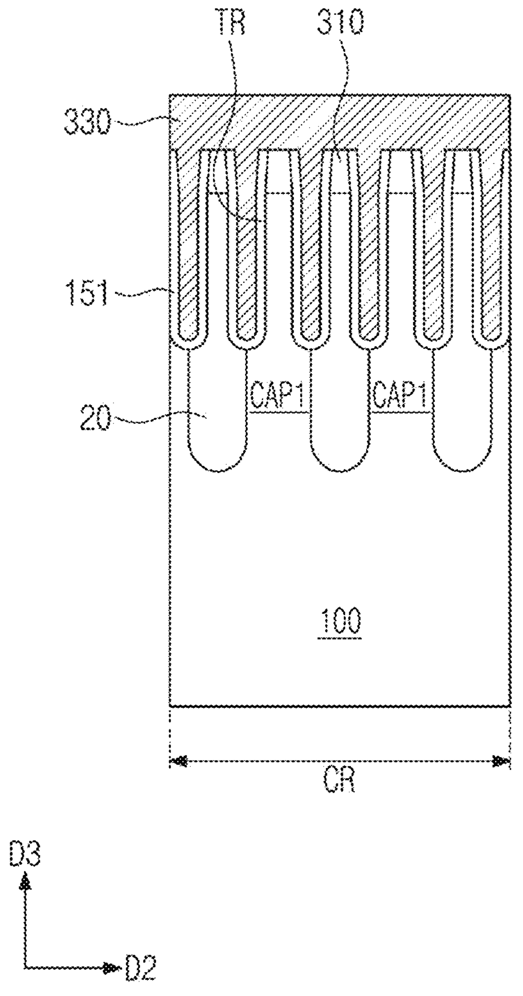

Referring to FIGS. 2A and 2B, a substrate 100 may be provided with a cell region CR, a dummy region DR, and a peripheral region PR. A device isolation layer 20 and a dielectric structure 10 may be formed on the substrate 100. Cell active patterns CAP1 and CAP2, dummy active patterns DAP, and peripheral active patterns PAP may be formed in the substrate 100.

Trenches TR may be formed which penetrate the cell active patterns CAP1 and CAP2 and the dummy active patterns DAP. The formation of the trench TR may include forming a cover dielectric layer 310 to cover the cell active patterns CAP1 and CAP2, the dummy active patterns DAP, and the peripheral active patterns PAP, and then forming the trench TR by etching the cover dielectric layer 310, the cell active patterns CAP1 and CAP2, the dummy active pattern DAP, the device isolation layer 20, and the dielectric structure 10. The cover dielectric layer 310 may include a dielectric material.

A first preliminary conductive layer 330 may be formed to fill the trench TR. The first preliminary conductive layer 330 may cover the cover dielectric layer 310. The first preliminary conductive layer 330 may include a conductive material. For example, the first preliminary conductive layer 330 may include titanium nitride. In some example embodiments, the formation of the first preliminary conductive layer 330 may include depositing a conductive material and performing a chemical mechanical polishing process.

Figure 3A:
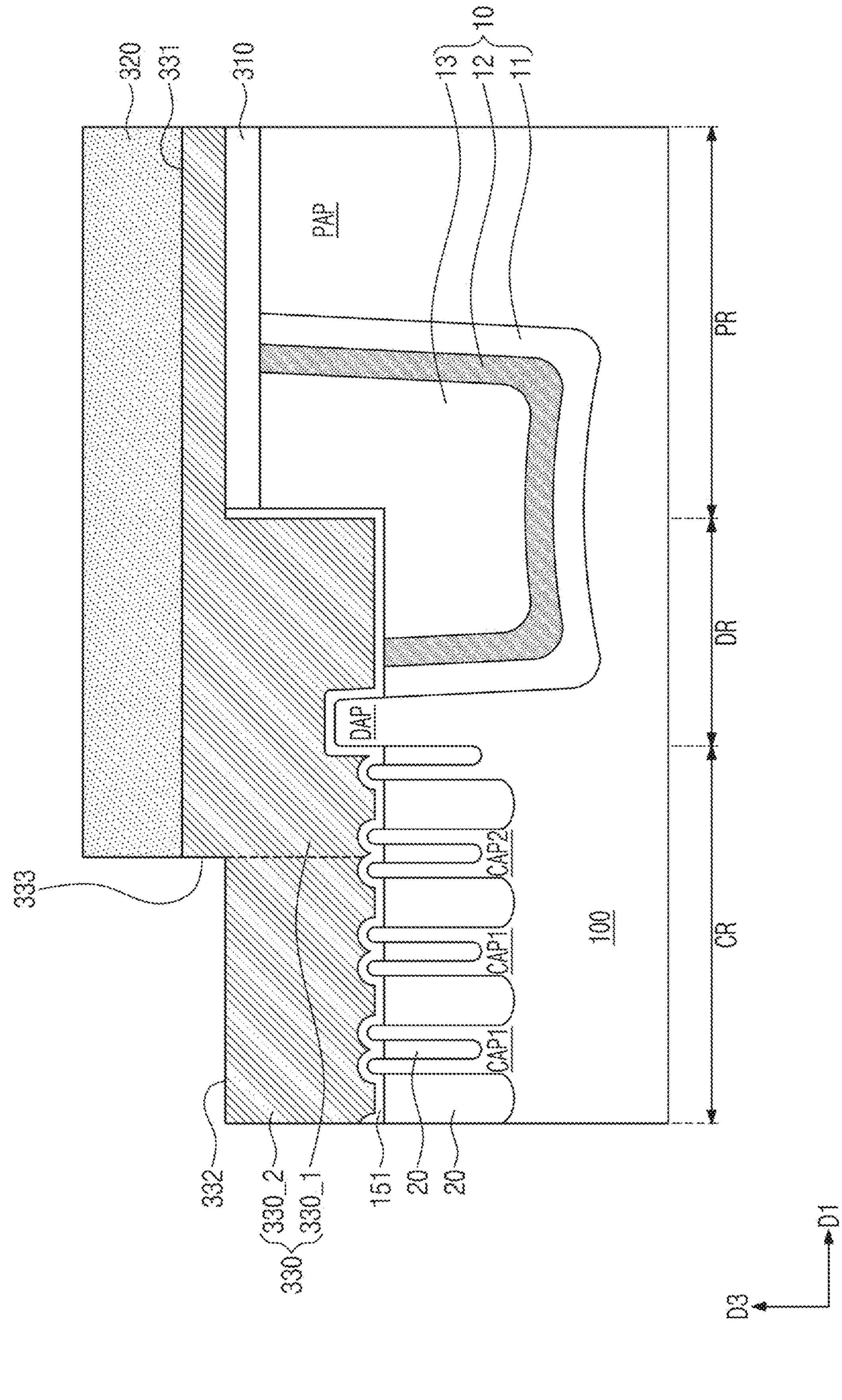
Figure 3B:
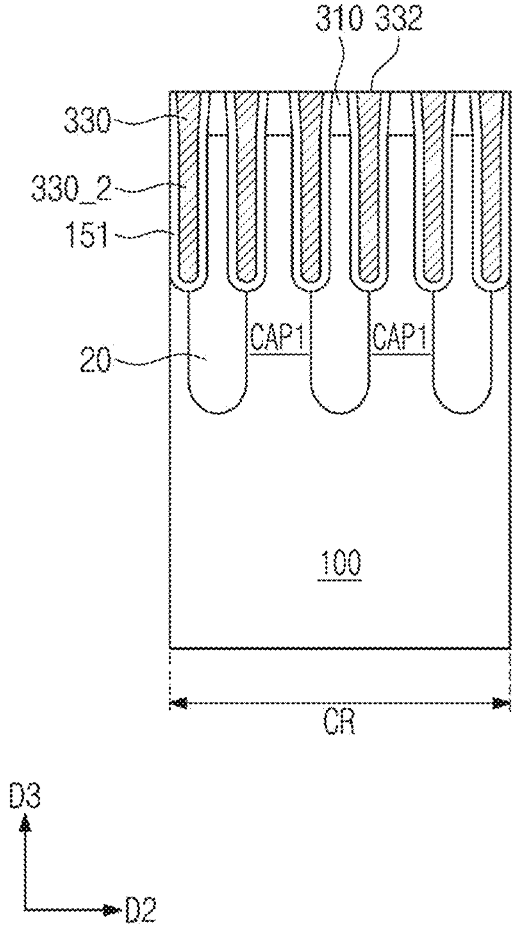

Referring to FIGS. 3A and 3B, a first top surface 331, a second top surface 332, and a sidewall 333 of the first preliminary conductive layer 330 may be formed. The formation of the first top surface 331, the second top surface 332, and the sidewall 333 of the first preliminary conductive layer 330 may include forming a photoresist pattern 320 to cover a first part 330_1 of the first preliminary conductive layer 330 and to expose a second part 330_2 of the first preliminary conductive layer 330, and etching the second part 330_2 of the first preliminary conductive layer 330 using the photoresist pattern 320 as an etching mask. For example, the first preliminary conductive layer 330 may be etched by an etch-back process.

The first top surface 331 and the first part 330_1 of the first preliminary conductive layer 330 may overlap in the third direction D3 with the dummy active pattern DAP. The second top surface 332 and the second part 330_2 of the first preliminary conductive layer 330 may overlap in the third direction D3 with a first cell active pattern CAP1. The first top surface 331 of the first preliminary conductive layer 330 may be located at a level higher than that of the second top surface 332 of the first preliminary conductive layer 330.

After the etching of the first preliminary conductive layer 330, the photoresist pattern 320 may be removed. For example, the photoresist pattern 320 may be removed by an ashing process or a strip process.

Figure 4A:
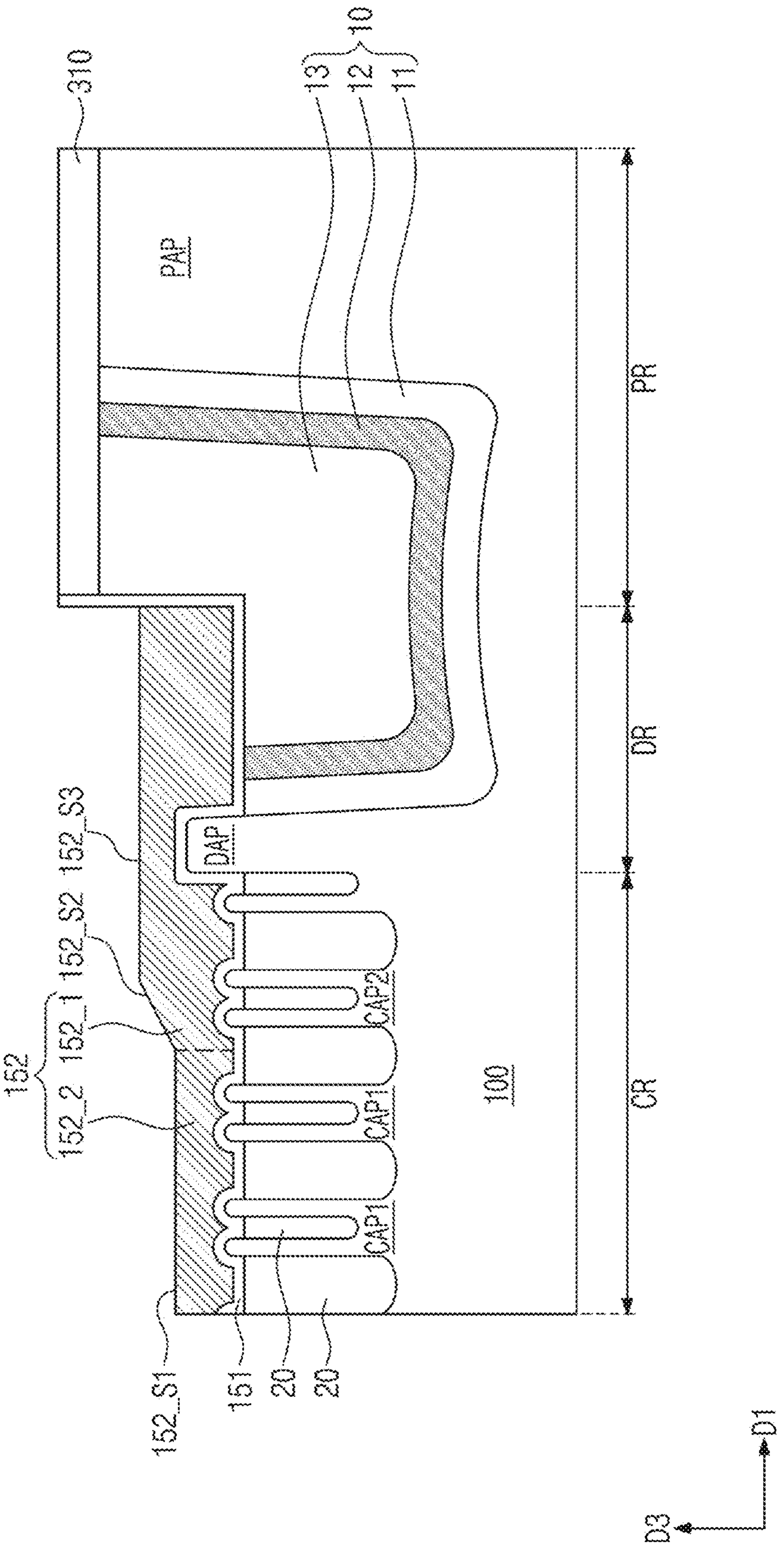
Figure 4B:
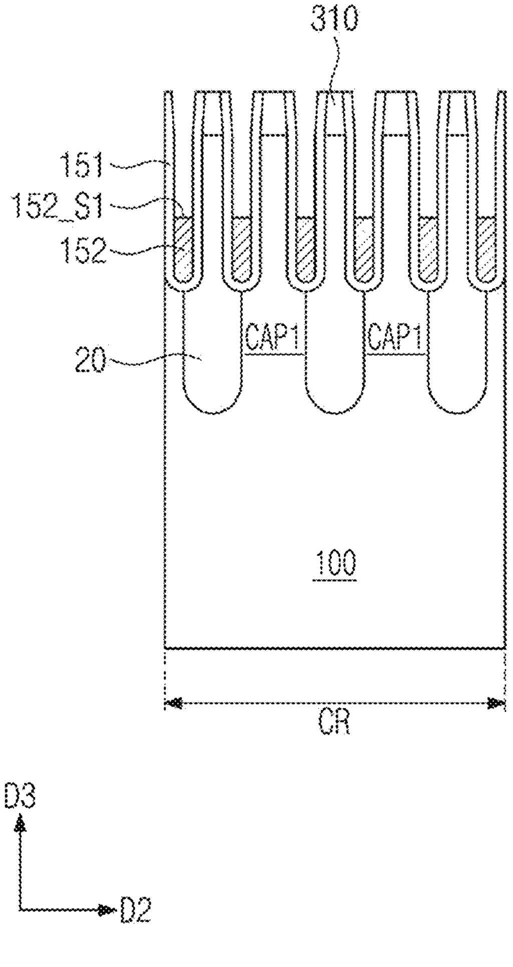

Referring to FIGS. 4A and 4B, a first cell gate conductive layer 152 may be formed. The first preliminary conductive layer 330 may be etched to form the first cell gate conductive layer 152. For example, an etch-back process may be employed such that the first preliminary conductive layer 330 may be etched to form the first cell gate conductive layer 152. The first preliminary conductive layer 330 may be etched such that the top surface of the etched first preliminary conductive layer 330 is located at a level lower than that of the cover dielectric layer 310, thereby forming the first cell gate conductive layer 152.

As the first preliminary conductive layer 330 includes the first top surface 331, the second top surface 332, and the sidewall 333, the first cell gate conductive layer 152 may include a dummy overlap section 152_1 and a cell overlap section 152_2. The first cell gate conductive layer 152 may include a first top surface 152_S1, a second top surface 152_S3, and an inclined surface 152_S2 of the first cell gate conductive layer 152.

In some example embodiments, after the etching of the first preliminary conductive layer 330, a strip process and an annealing process may be performed.

Figure 5A:
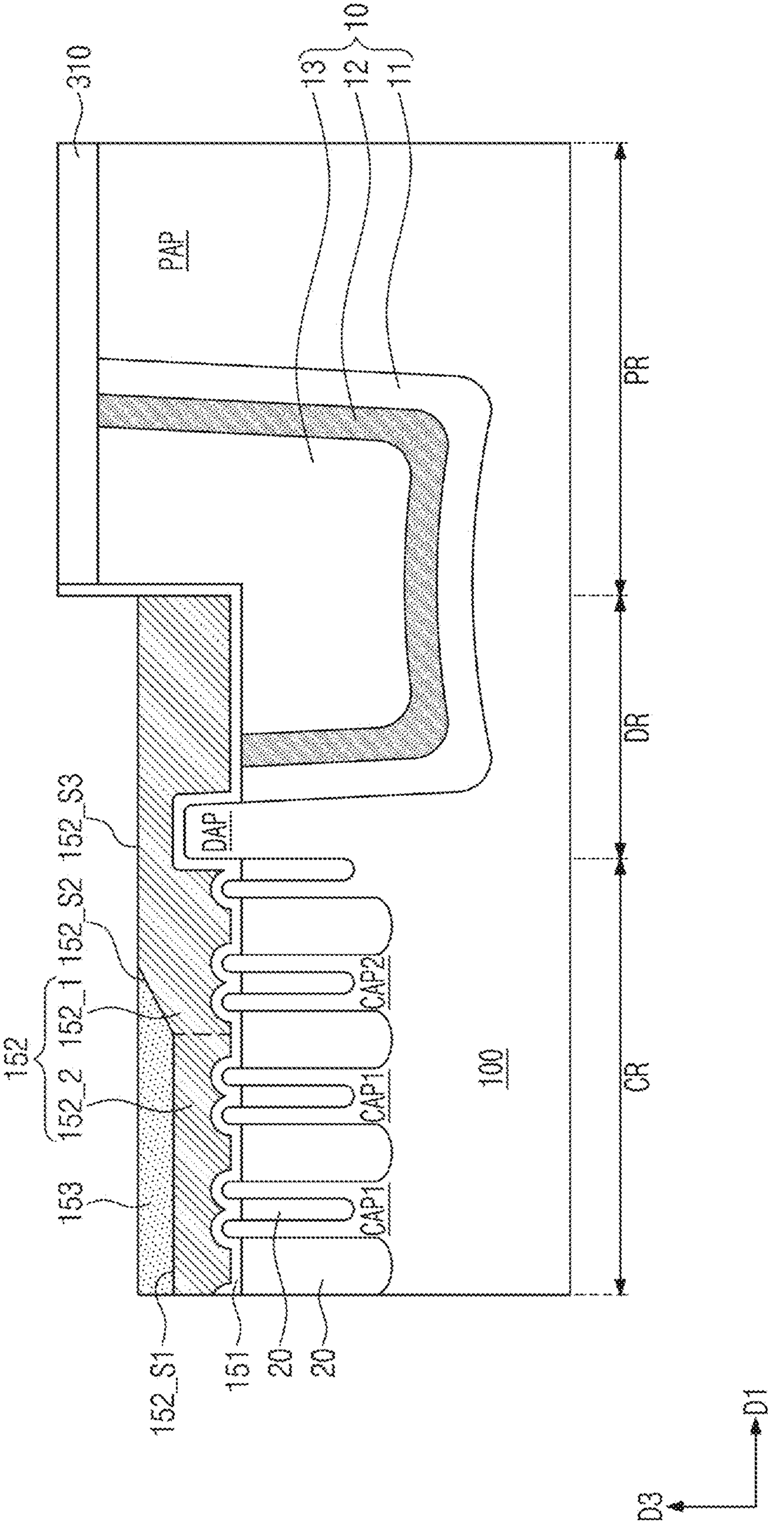
Figure 5B:
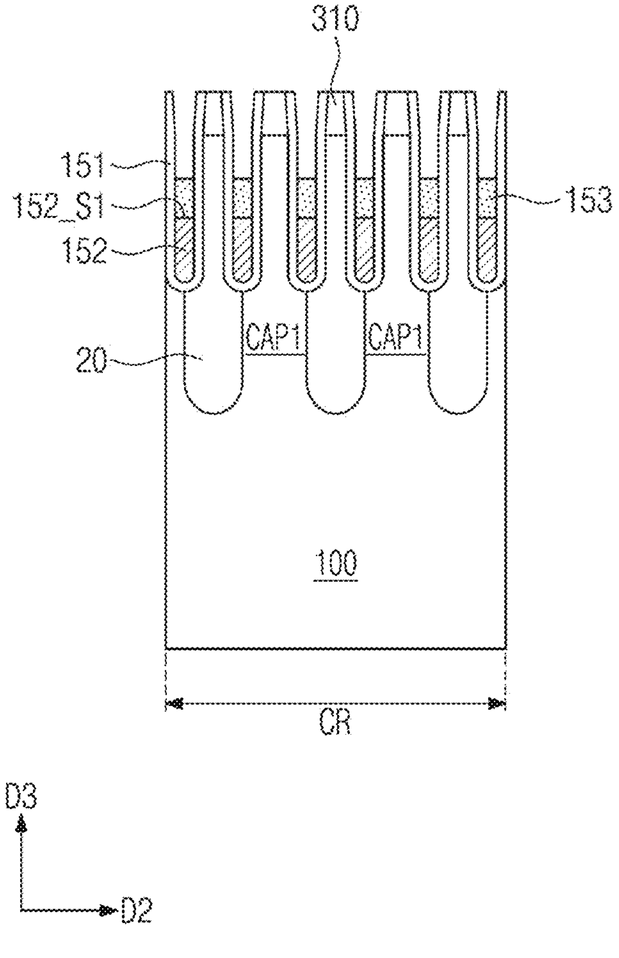

Referring to FIGS. 5A and 5B, a second cell gate conductive layer 153 may be formed. In some example embodiments, the formation of the second cell gate conductive layer 153 may include forming a second preliminary conductive layer to cover the cover dielectric layer 310 and the first top surface 152_S1, the second top surface 152_S3, and the inclined surface 152_S2 of the first cell gate conductive layer 152, performing a chemical mechanical polishing process on the second preliminary conductive layer, performing a cleaning process on the second preliminary conductive layer, allowing the second preliminary conductive layer to undergo an etch-back process to expose the cover dielectric layer 310 and the second top surface 152_S3 of the first cell gate conductive layer 152, and performing a strip process on the second preliminary conductive layer. The second preliminary conductive layer may include a conductive material. For example, the second preliminary conductive layer may include polysilicon.

Figure 6A:
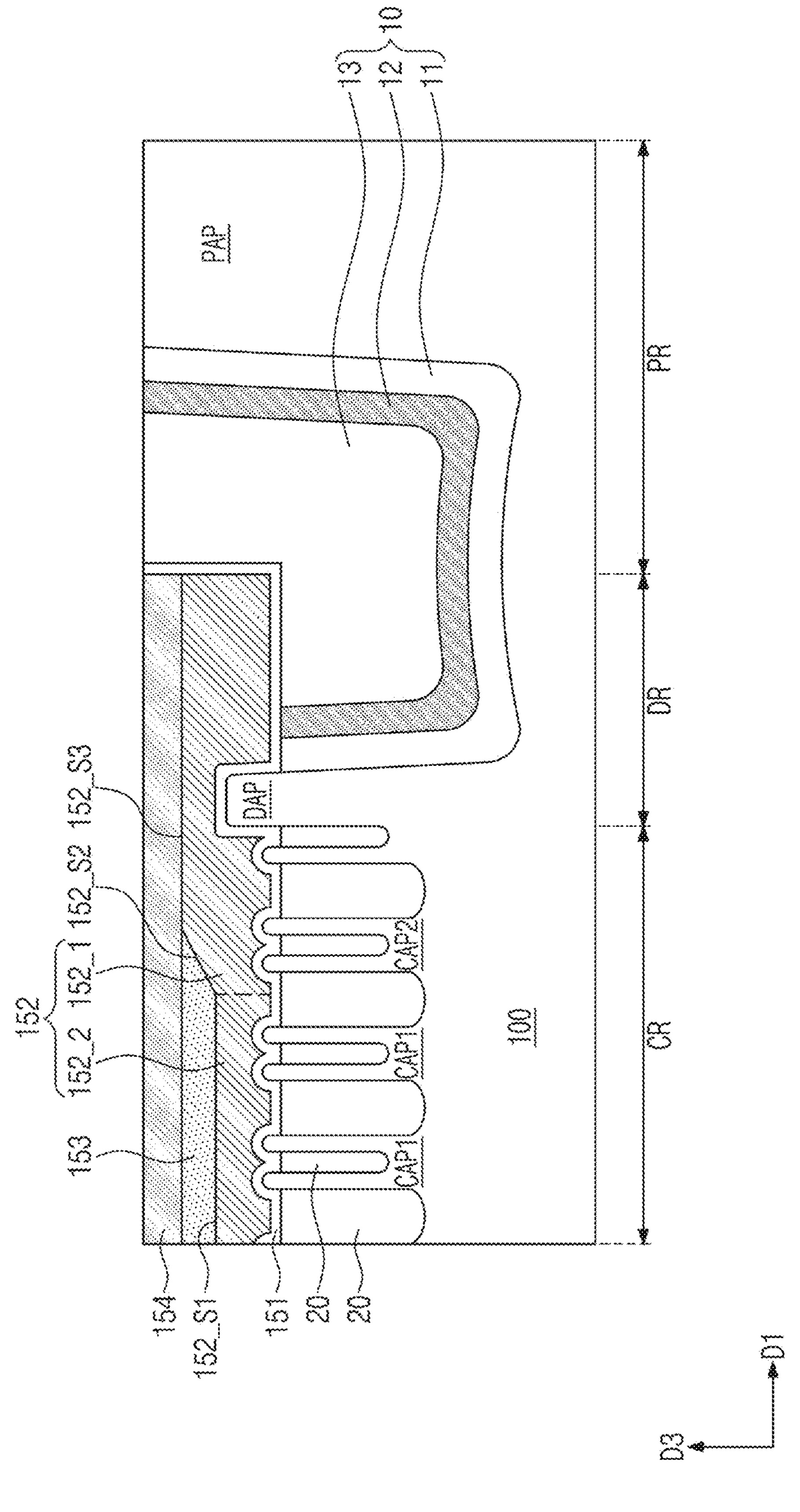
Figure 6B:
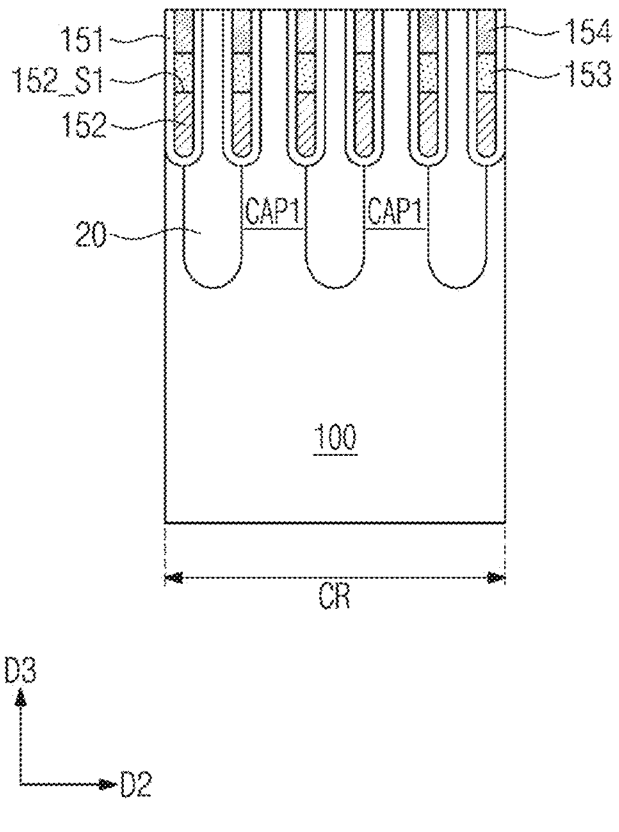

Referring to FIGS. 6A and 6B, a cell gate capping layer 154 may be formed. In some example embodiments, the formation of the cell gate capping layer 154 may include forming a preliminary dielectric layer to cover the first and second cell gate conductive layers 152 and 153 and the cover dielectric layer 310, and performing an etch-back process on the preliminary dielectric layer. The preliminary dielectric layer may include a dielectric material. For example, the preliminary dielectric layer may include nitride.

After the formation of the cell gate capping layer 154, the cover dielectric layer 310 may be removed. For example, the cover dielectric layer 310 may be removed by a strip process.

Referring to FIGS. 1A, 1B, 1C, 1D, 1E, and 1F, a dielectric pattern 121, bit-line structures 130, a dummy line structure 140, peripheral gate structures 160, dielectric fences 240, a first separation structure 250, node contacts NC, landing pads LP, data storage patterns DSP, a filling dielectric layer 181, conductive structures 191, and second separation structures 260 may be formed.

Figure 7:
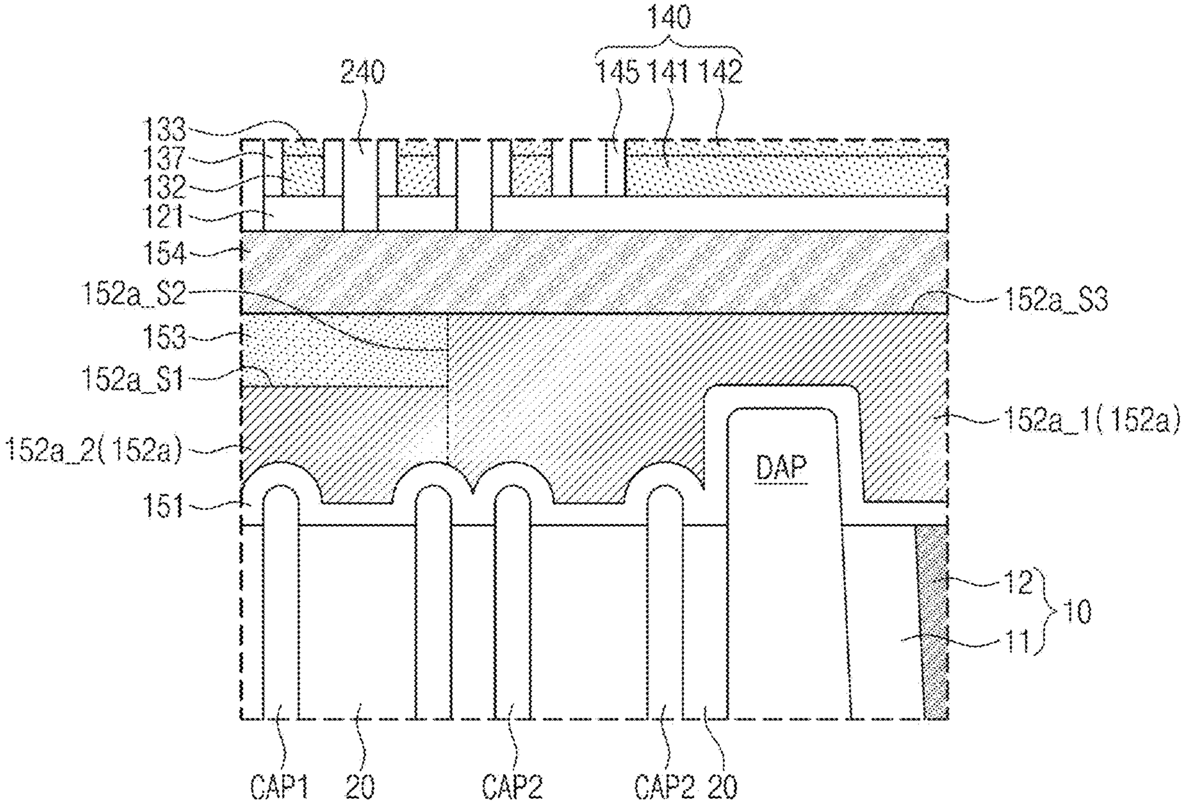
FIG. 7 illustrates an enlarged cross-sectional view showing a semiconductor device according to an example embodiment.

FIG. 7 illustrates an enlarged cross-sectional view showing a semiconductor device according to an example embodiment.

Referring to FIG. 7, a first cell gate conductive layer 152*a* of a semiconductor device may include a dummy overlap section 152*a*_1 and a cell overlap section 152*a*_2. The first cell gate conductive layer 152*a* may have a first top surface 152*a*_S1 in contact with a bottom surface of the second cell gate conductive layer 153, and may also include a second top surface 152*a*_S3 in contact with a bottom surface of the cell gate capping layer 154. The first top surface 152*a*_S1 of the first cell gate conductive layer 152*a* may be located at a level lower than that of the second top surface 152*a*_S3 of the first cell gate conductive layer 152*a*. The first top surface 152*a*_S1 of the first cell gate conductive layer 152*a* may be a top surface of the cell overlap section 152*a*_2. The second top surface 152*a*_S3 of the first cell gate conductive layer 152*a* may be a top surface of the dummy overlap section 152*a*_1.

The first cell gate conductive layer 152*a* may include a sidewall 152*a*_S2 in contact with a sidewall of the second cell gate conductive layer 153. The sidewall 152*a*_S2 of the first cell gate conductive layer 152*a* may be parallel to the third direction D3. For example, the sidewall 152*a*_S2 of the first cell gate conductive layer 152*a* may be perpendicular to the first and second top surfaces 152*a*_S1 and 152*a*_S2 of the first cell gate conductive layer 152*a*.

Figure 8:
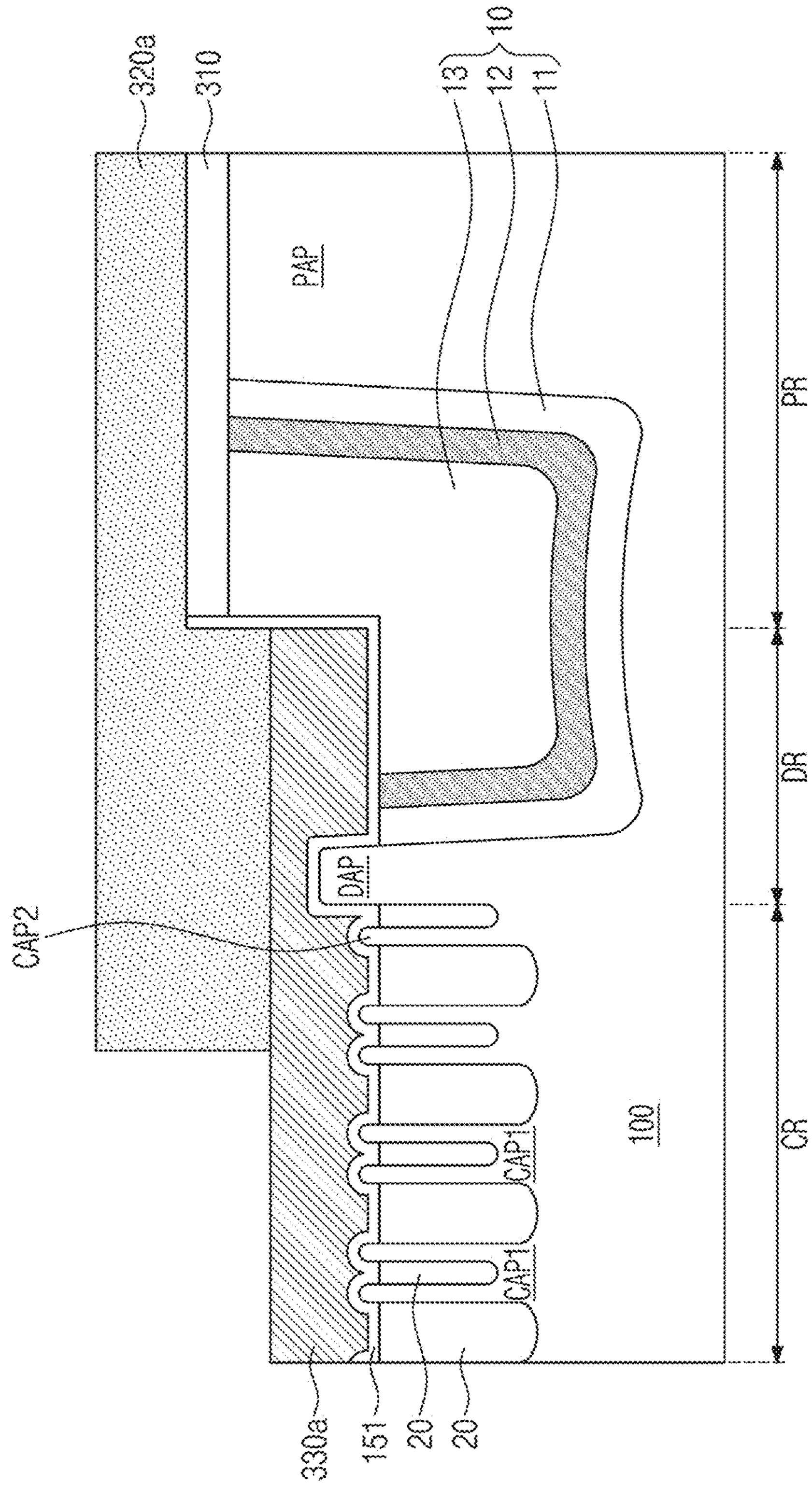
FIG. 8 illustrates a cross-sectional view showing a method of fabricating a semiconductor device according to FIG. 7.

FIG. 8 illustrates a cross-sectional view showing a method of fabricating a semiconductor device according to FIG. 7.

Referring to FIG. 8, similar to that discussed in FIGS. 2A and 2B, first and second cell active patterns CAP1 and CAP2, a dummy active pattern DAP, a peripheral active pattern PAP, a device isolation layer 20, a dielectric structure 10, a cover dielectric layer 310, a cell gate dielectric layer 151, and a first preliminary conductive layer 330*a* may be formed.

Afterwards, the first preliminary conductive layer 330*a* may be etched to have a top surface located at a level lower than that of the cover dielectric layer 310. For example, the first preliminary conductive layer 330*a* may be etched by an etch-back process.

A photoresist pattern 320*a* may be formed to cover a portion of the etched first preliminary conductive layer 330*a*. The photoresist pattern 320*a* may be used as an etching mask to etch the first preliminary conductive layer 330*a* to form a first cell gate conductive layer (see 152*a* of FIG. 7). As the photoresist pattern 320*a* is used etch the first preliminary conductive layer 330*a*, the first cell gate conductive layer 152*a* may have a first top surface (see 152*a*_S1 of FIG. 7), a second top surface (see 152*a*_S3 of FIG. 7), and a sidewall (see 152*a*_S2 of FIG. 7).

Similar to that discussed in FIGS. 6A and 6B, a second cell gate conductive layer 153 and a cell gate capping layer 154 may be formed.

Similar to that discussed in FIGS. 1A, 1B, 1C, 1D, 1E, and 1F, a dielectric pattern 121, bit-line structures 130, a dummy line structure 140, peripheral gate structures 160, dielectric fences 240, a first separation structure 250, node contacts NC, landing pads LP, data storage patterns DSP, a filling dielectric layer 181, conductive structures 191, and second separation structures 260 may be formed.

Figure 9:
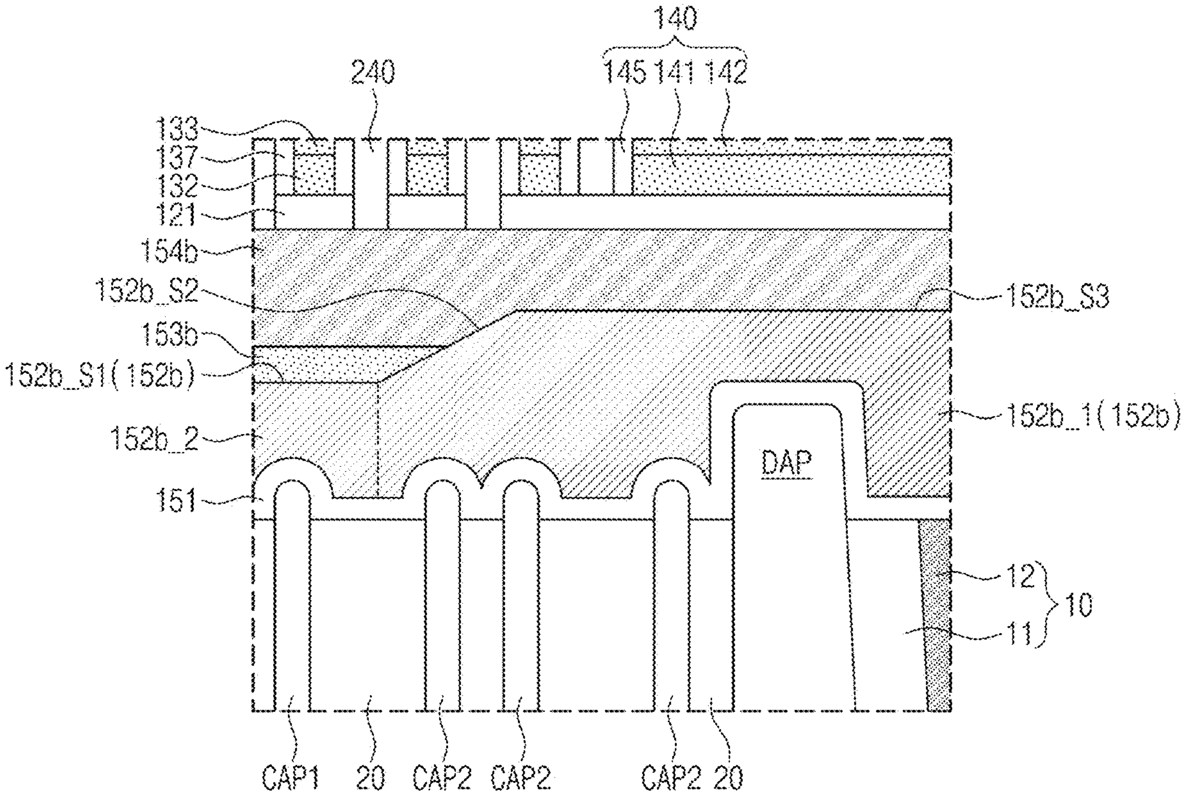
FIG. 9 illustrates an enlarged cross-sectional view showing a semiconductor device according to an example embodiment.

FIG. 9 illustrates an enlarged cross-sectional view showing a semiconductor device according to an example embodiment.

Referring to FIG. 9, a first cell gate conductive layer 152*b* of a semiconductor device may include a dummy overlap section 152*b*_1 and a cell overlap section 152*b*_2. The first cell gate conductive layer 152*b* may have a first top surface 152*b*_S1 in contact with a second cell gate conductive layer 153*b* and a second top surface 152*b*_S3 in contact with a cell gate capping layer 154*b*. An inclined surface 152*b*_S2 of the first cell gate conductive layer 152*b* may be in contact with the second cell gate conductive layer 153*b* and the cell gate capping layer 154*b*. The inclined surface 152*b*_S2 of the first cell gate conductive layer 152*b* may include a lower portion in contact with the second cell gate conductive layer 153*b* and an upper portion in contact with the cell gate capping layer 154*b*.

The second cell gate conductive layer 153*b* may have a top surface at a level lower than that of the second top surface 152*b*_S3 of the first cell gate conductive layer 152*b*. The second cell gate conductive layer 153*b* may include an inclined surface that corresponds to the lower portion of the inclined surface 152*b*_S2. The cell gate capping layer 154*b* may include an inclined surface that corresponds to the upper portion of the inclined surface 152*b*_S2.

Figure 10:
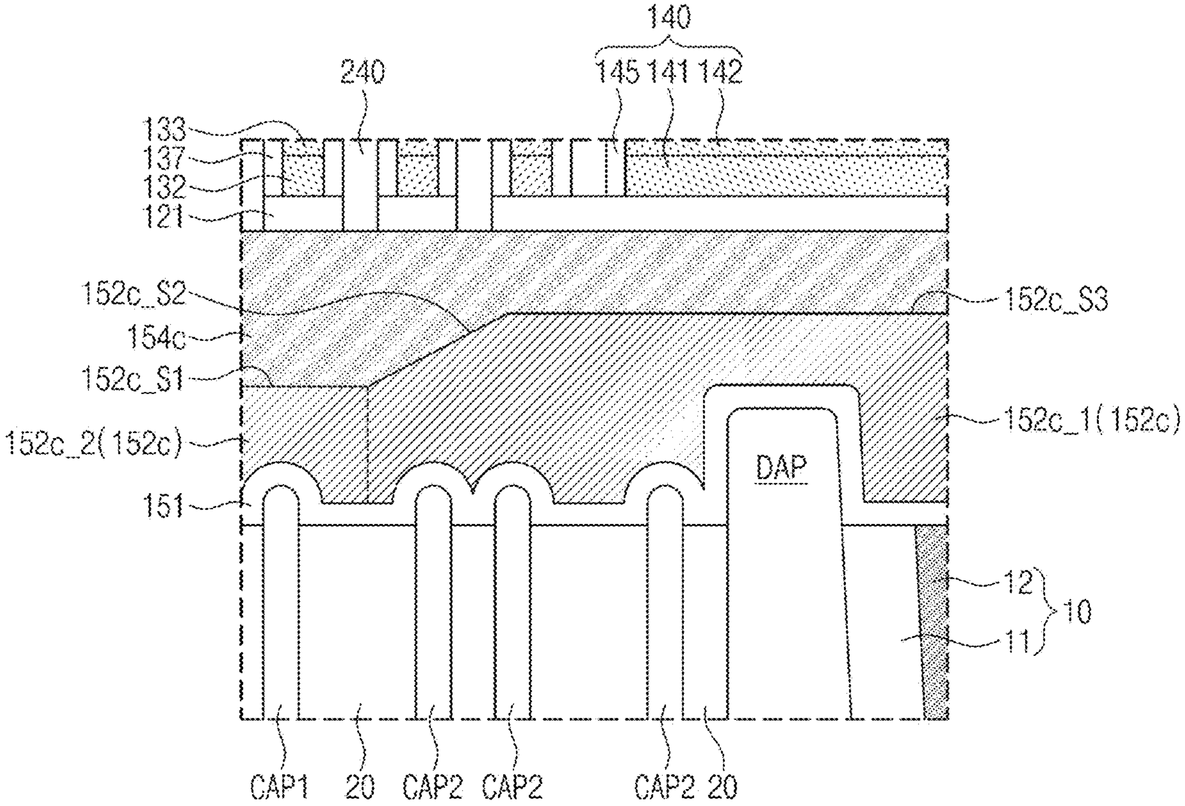
FIG. 10 illustrates an enlarged cross-sectional view showing a semiconductor device according to an example embodiment.

FIG. 10 illustrates an enlarged cross-sectional view showing a semiconductor device according to an example embodiment.

Referring to FIG. 10, a cell gate conductive layer 152*c* of a semiconductor device may include a dummy overlap section 152*c*_1 and a cell overlap section 152*c*_2. The cell gate conductive layer 152*c* may have a first top surface 152*c*_S1, a second top surface 152*c*_S3, and an inclined surface 152*c*_S2. The first top surface 152*c*_S1, the second top surface 152*c*_S3, and the inclined surface 152*c*_S2 of the cell gate conductive layer 152*c* may be in contact with a cell gate capping layer 154*c*.

Figure 11:
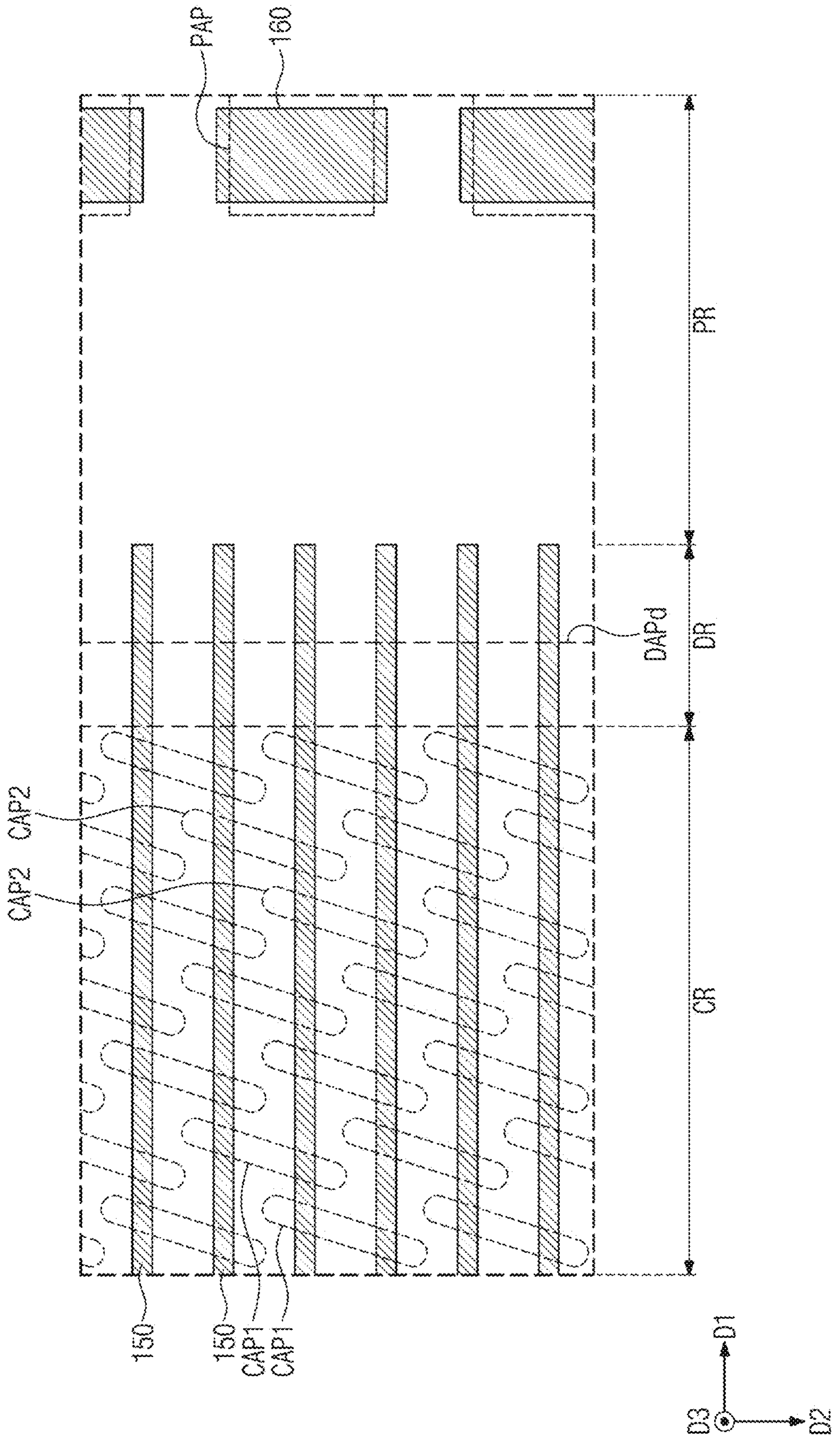
FIG. 11 illustrates a plan view showing a semiconductor device according to an example embodiment.

FIG. 11 illustrates a plan view showing a semiconductor device according to an example embodiment.

Referring to FIG. 11, a substrate of a semiconductor device may include first and second cell active patterns CAP1 and CAP2 and a dummy active pattern DAPd. The dummy active pattern DAPd may be disposed on the dummy region DR. The dummy region DR of the substrate may include an upper portion that protrudes in the third direction D3, and the dummy active pattern DAPd may be the protruding upper portion of the dummy region DR.

The dummy active pattern DAPd may have a bar shape that extends in the second direction D2. A first cell gate conductive layer of the cell gate structure 150 may include a dummy overlap section that overlaps in the third direction D3 with the dummy active pattern DAPd and the second cell active pattern CAP2, and may also include a cell overlap section that overlaps in the third direction D3 with the first cell active pattern CAP1.

Figure 12:
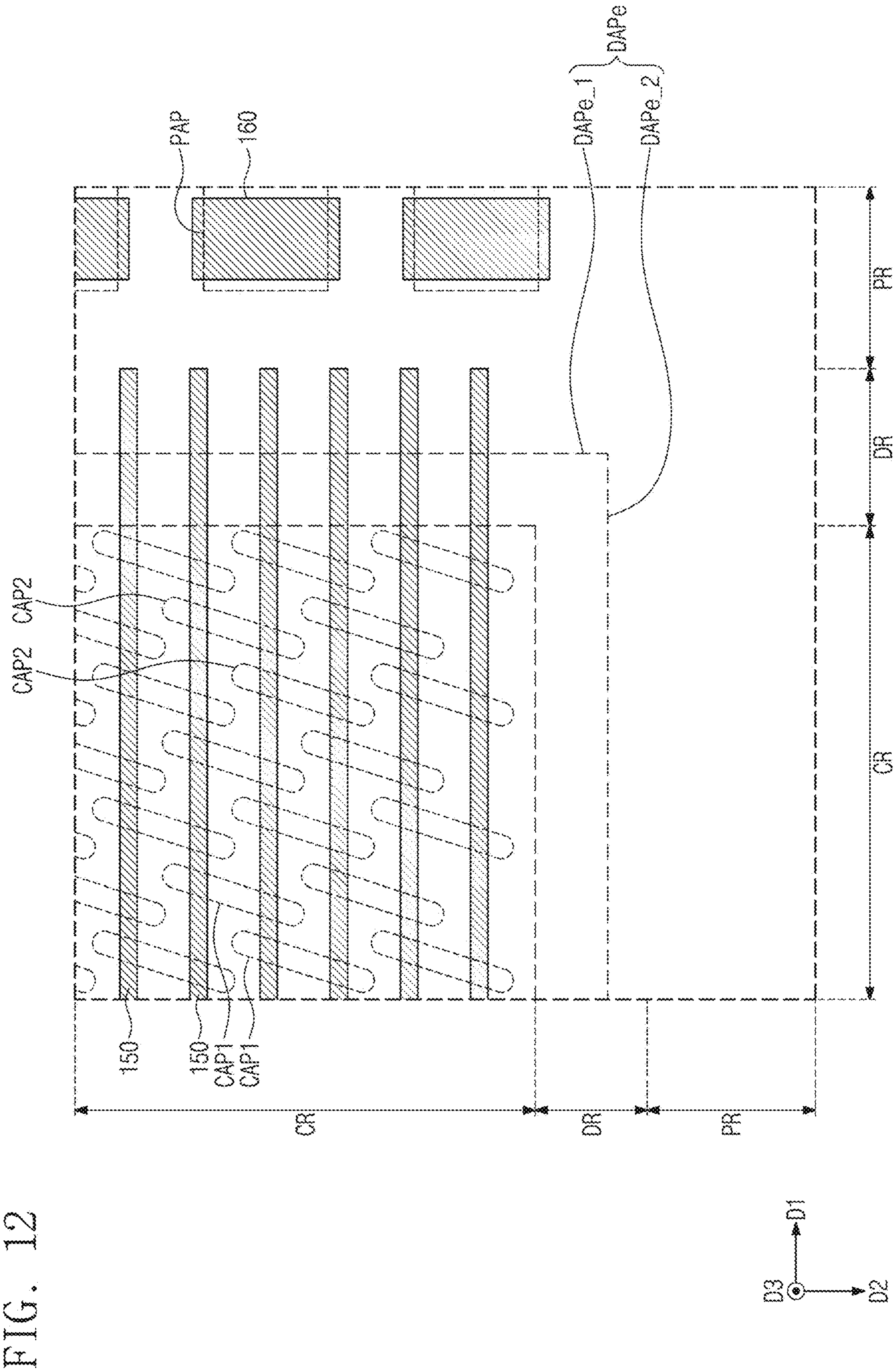
FIG. 12 illustrates a plan view showing a semiconductor device according to an example embodiment.

FIG. 12 illustrates a plan view showing a semiconductor device according to an example embodiment.

Referring to FIG. 12, a substrate of a semiconductor device may include first and second cell active patterns CAP1 and CAP1 and a dummy active pattern DAPe. The dummy active pattern DAPe may be disposed on the dummy region DR. The dummy region DR of the substrate may include an upper portion that protrudes in the third direction D3, and the dummy active pattern DAPe may be the protruding upper portion of the dummy region DR.

The dummy active pattern DAPe may include a first part DAPe_1 that extends in the second direction D2 and a second part DAPe_2 that extends in the first direction D1. In some example embodiments, the dummy active pattern DAPe may include two first parts DAPe_1 and two second parts DAPe_2, and the first and second cell active patterns CAP1 and CAP2 of the cell region CR may be surrounded by the two first parts DAPe_1 and the two second parts DAPe_2 of the dummy active pattern DAPe.

A first cell gate conductive layer of the cell gate structure 150 may include a dummy overlap section that overlaps in the third direction D3 with the dummy active pattern DAPe and the second cell active pattern CAP2, and may also include a cell overlap section that overlaps in the third direction D3 with the first cell active pattern CAP1.

In a semiconductor device according to some example embodiments of the present inventive concepts, as a cell gate conductive layer has a dummy overlap section having a relatively large thickness, the cell gate conductive layer may be mitigated or prevented from being cut by a dummy active pattern.

Although the present inventive concepts have been described in connection with the some example embodiments of the present inventive concepts illustrated in the accompanying drawings, it will be understood by one of ordinary skill in the art that variations in form and detail may be made therein without departing from the spirit and essential feature of the present inventive concepts. The above disclosed example embodiments should thus be considered illustrative and not restrictive. Moreover, some example embodiments of the present inventive concepts may be combined with each other.

What is claimed is:

1. A semiconductor device, comprising:
- a substrate including a first cell active pattern, a second cell active pattern, and a dummy active pattern;
- a cell gate dielectric layer on the first cell active pattern, the second cell active pattern, and the dummy active pattern;
- a first cell gate conductive layer on the cell gate dielectric layer; and
- a bit-line structure electrically connected to the first cell active pattern,
- wherein a distance between the second cell active pattern and the dummy active pattern is less than a distance between the first cell active pattern and the dummy active pattern,
- wherein the first cell gate conductive layer includes,
  - a dummy overlap section overlapping the dummy active pattern and the second cell active pattern, and
  - a cell overlap section overlapping the first cell active pattern, and
- wherein a top surface of the dummy overlap section is at a level higher than a level of a top surface of the cell overlap section.

2. The semiconductor device of claim 1, wherein the dummy overlap section includes an inclined surface that connects the top surface of the dummy overlap section to the top surface of the cell overlap section.

3. The semiconductor device of claim 2, wherein a level of the inclined surface rises as a distance from the dummy active pattern decreases.

4. The semiconductor device of claim 2, further comprising:
- a second cell gate conductive layer in contact with the top surface of the cell overlap section; and
- a cell gate capping layer in contact with the top surface of the dummy overlap section.

5. The semiconductor device of claim 4, wherein the inclined surface is in contact with the second cell gate conductive layer and is spaced apart from the cell gate capping layer.

6. The semiconductor device of claim 4, wherein the inclined surface is in contact with the second cell gate conductive layer and the cell gate capping layer.

7. The semiconductor device of claim 1, wherein
- the dummy overlap section includes
  - a first part overlapping the dummy active-pattern, and
  - a second part overlapping the second cell active pattern, and
- wherein a maximum thickness of the first part of the dummy overlap section is less than a maximum thickness of the second part of the dummy overlap section.

8. The semiconductor device of claim 7, further comprising:
- a dielectric structure defining the dummy active pattern,
- wherein the dummy overlap section further includes a third part overlapping the dielectric structure,
- wherein the maximum thickness of the first part of the dummy overlap section is less than a maximum thickness of the third part of the dummy overlap section.

9. The semiconductor device of claim 8, wherein a maximum thickness of the cell overlap section is less than the maximum thickness of the second part of the dummy overlap section and less than the maximum thickness of the third part of the dummy overlap section.

10. A semiconductor device, comprising:
- a substrate including a first cell active pattern and a dummy active pattern;
- a cell gate dielectric layer on the first cell active pattern and the dummy active pattern;
- a cell gate conductive layer on the cell gate dielectric layer; and
- a bit-line structure electrically connected to the first cell active pattern,
- wherein the cell gate conductive layer includes
  - a dummy overlap section overlapping the dummy active pattern, and
  - a cell overlap section overlapping the first cell active pattern, and
- wherein a maximum thickness of the dummy overlap section is greater than a maximum thickness of the cell overlap section, and
- wherein a top surface of the dummy overlap section is at a level higher than a level of a top surface of the cell overlap section.

11. The semiconductor device of claim 10, wherein
- the substrate further includes a second cell active pattern adjacent to the dummy active pattern, and
- the dummy overlap section overlaps the second cell active pattern.

12. The semiconductor device of claim 11, wherein
- the dummy overlap section includes
  - a first part overlapping the dummy pattern, and
  - a second part overlapping the second cell active pattern, and a lowermost portion of the first part of the dummy overlap section is at a level higher than a level of a lowermost portion of the second part of the dummy overlap section.

13. The semiconductor device of claim 12, wherein a maximum thickness of the first part of the dummy overlap section is less than a maximum thickness of the second part of the dummy overlap section.

14. The semiconductor device of claim 12, further comprising:

a dielectric structure defining the dummy active pattern, wherein the dummy overlap section further includes a third part overlapping the dielectric structure, and wherein a lowermost portion of the third part of the dummy overlap section is at a level lower than the level of the lowermost portion of the first part of the dummy overlap section.

15. The semiconductor device of claim 14, wherein a maximum thickness of the third part of the dummy overlap section is greater than a maximum thickness of the first part of the dummy overlap section.

16. The semiconductor device of claim 12, wherein the second part of the dummy overlap section includes an inclined surface connected to a top surface of the cell overlap section, and a top surface connected to the inclined surface.

17. The semiconductor device of claim 16, wherein the top surface of the second part of the dummy overlap section is at a level higher than a level of the top surface of the cell overlap section.

18. The semiconductor device of claim 10, wherein a top surface of the cell overlap section is at a level lower than a level of a top surface of the dummy overlap section, and the semiconductor device further comprises a cell gate capping layer in contact with the top surface of the cell overlap section and the top surface of the dummy overlap section.

19. A semiconductor device, comprising:

a substrate including a first cell active pattern, a second cell active pattern, and a dummy active pattern;

a cell gate dielectric layer on the first cell active pattern, the second cell active pattern, and the dummy active pattern;

a first cell gate conductive layer on the cell gate dielectric layer;

a second cell gate conductive layer on the first cell gate conductive layer;

a cell gate capping layer on the first cell gate conductive layer and the second cell gate conductive layer;

a dielectric pattern on the cell gate capping layer;

a bit-line structure on the dielectric pattern;

a node contact on the first cell active pattern;

a landing pad on the node contact; and a data storage pattern electrically connected to the landing pad, wherein the first cell gate conductive layer includes a first top surface in contact with the second cell gate conductive layer, and a second top surface in contact with the cell gate capping layer, and wherein the first top surface is at a level lower than a level of the second top surface.

20. The semiconductor device of claim 19, wherein the first cell gate conductive layer further includes an inclined surface connecting the first top surface to the second top surface.

* * * * *